(12) United States Patent  (10) Patent No.: US 9,389,519 B2
Kita  (45) Date of Patent: Jul. 12, 2016

(54) MEASURING METHOD AND MEASURING APPARATUS OF PUPIL TRANSMITTANCE DISTRIBUTION, EXPOSURE METHOD AND EXPOSURE APPARATUS, AND DEVICE MANUFACTURING METHOD

(75) Inventor: Naonori Kita, Saitama (JP)

(73) Assignee: NIKON CORPORATION, Tokyo (JP)

( * ) Notice: Subject to any disclaimer, the term of this patent is extended or adjusted under 35 U.S.C. 154(b) by 1286 days.

(21) Appl. No.: 13/011,320

(22) Filed: Jan. 21, 2011

(65) Prior Publication Data

US 2011/0205514 A1  Aug. 25, 2011

Related U.S. Application Data

(60) Provisional application No. 61/308,087, filed on Feb. 25, 2010.

(51) Int. Cl.
*G01B 9/00* (2006.01)
*G03B 27/32* (2006.01)
(Continued)

(52) U.S. Cl.
CPC .......... *G03F 7/70941* (2013.01); *G01M 11/02* (2013.01); *G03F 7/706* (2013.01); *G03F 7/70133* (2013.01); *G03F 7/70591* (2013.01)

(58) Field of Classification Search
CPC . G01M 11/00; G01M 11/02; G01M 11/0285; G01M 11/0292; G03B 27/54; G03F 7/70133; G03F 7/70483; G03F 7/70516; G03F 7/70591; G03F 7/706; G03F 7/7085; G03F 7/70941
USPC ....................... 355/67, 68, 77; 356/124, 124.5
See application file for complete search history.

(56) References Cited

U.S. PATENT DOCUMENTS 4,175,830 A  11/1979  Marie
6,900,915 B2  5/2005  Nanjyo et al.
(Continued)

FOREIGN PATENT DOCUMENTS

CN  100350326 C  11/2007
CN  100539018 C  9/2009
(Continued)

OTHER PUBLICATIONS

International Search Report issued in International Application No. PCT/JP2011/053595 dated May 3, 2011.
(Continued)

*Primary Examiner* — Colin Kreutzer
(74) *Attorney, Agent, or Firm* — Oliff PLC

(57) ABSTRACT

A measuring apparatus for measuring a pupil transmittance distribution of an optical system to be examined has a diffraction grating mounted on a first surface in an optical Fourier transform relation with a pupil of the optical system, an illumination optical system which makes a beam inclined relative to the optical axis, incident to a predetermined position on the first surface so that a +first-order diffracted beam, generated through the diffraction grating, passes through a first pupil partial region in an effective region of the pupil and so that a −first-order diffracted beam, generated through the diffraction grating, passes through a second pupil partial region, and a measuring unit which measures an intensity of the +first-order diffracted beam, and an intensity of the −first-order diffracted beam, and determines a ratio of a pupil transmittance in the first and second pupil partial region regions.

22 Claims, 25 Drawing Sheets

(51) Int. Cl.
  *G03B 27/54* (2006.01)
  *G03B 27/74* (2006.01)
  *G03F 7/20* (2006.01)
  *G01M 11/02* (2006.01)

(56) References Cited

U.S. PATENT DOCUMENTS

| | | | |
|---|---|---|---|
| 6,913,373 | B2 | 7/2005 | Tanaka et al. |
| 7,095,546 | B2 | 8/2006 | Mala et al. |
| 2001/0019407 | A1 | 9/2001 | Sato et al. |
| 2002/0001088 | A1 | 1/2002 | Wegmann et al. |
| 2002/0159049 | A1 | 10/2002 | Sato et al. |
| 2003/0133099 | A1 | 7/2003 | Shiode |
| 2004/0180278 | A1 | 9/2004 | Sato et al. |
| 2005/0078287 | A1 | 4/2005 | Sengers et al. |
| 2006/0055909 | A1 | 3/2006 | Fiolka et al. |
| 2006/0170901 | A1 | 8/2006 | Tanitsu et al. |
| 2007/0146676 | A1 | 6/2007 | Tanitsu et al. |
| 2007/0296936 | A1 | 12/2007 | Kato et al. |
| 2008/0030707 | A1* | 2/2008 | Tanaka et al. ............ 355/67 |
| 2008/0252876 | A1 | 10/2008 | Mengel et al. |

FOREIGN PATENT DOCUMENTS

| | | |
|---|---|---|
| DE | 10 2006 015 213 A1 | 10/2007 |
| EP | 0 779 530 A1 | 6/1997 |
| EP | 1 681 710 A1 | 7/2006 |
| JP | A-6-124873 | 5/1994 |
| JP | A-10-303114 | 11/1998 |
| JP | A 2001-230179 | 8/2001 |
| JP | A 2002-329653 | 11/2002 |
| JP | A-2004-304135 | 10/2004 |
| JP | A-2006-113437 | 4/2006 |
| WO | WO99/49504 | 9/1999 |
| WO | WO 2005/069081 A2 | 7/2005 |
| WO | WO 2005/071671 A2 | 8/2005 |

OTHER PUBLICATIONS

Office Action mailed Sep. 12, 2014 in Japanese Patent Application No. 2011-033127 (with translation).

International Search Report issued in International Application No. PCT/JP2011/053588 dated May 18, 2011.

Written Opinion of the International Searching Authority issued in International Application No. PCT/JP2011/053588 dated May 18, 2011.

Sato, K. et al., "Measurement of Transmittance Variation of Projection Lenses Depending on the Light Paths Using a Grating-Pinhole Mask," *Proceedings of SPIE*, 2001, pp. 379-386, vol. 4346.

Jan. 6, 2015 Office Action issued in Taiwanese Patent Application No. 100105040.

* cited by examiner

MEASURING METHOD AND MEASURING APPARATUS OF PUPIL TRANSMITTANCE DISTRIBUTION, EXPOSURE METHOD AND EXPOSURE APPARATUS, AND DEVICE MANUFACTURING METHOD

CROSS-REFERENCE TO RELATED APPLICATIONS

This application claims priority to Provisional Application No. 61/308,087 filed on Feb. 25, 2010 by the same Applicant, which is hereby incorporated by reference in its entirety.

BACKGROUND

1. Field

One embodiment of the invention relates to a measuring method and measuring apparatus of pupil transmittance distribution, an exposure method and exposure apparatus, and a device manufacturing method. More particularly, the present invention relates to measurement of a pupil transmittance distribution of a projection optical system mounted on an exposure apparatus used, for example, in manufacturing devices such as semiconductor devices or liquid crystal display devices by a photolithography process.

2. Description of the Related Art

The photolithography process for manufacture of the semiconductor devices and others is carried out using an exposure apparatus for implementing projection exposure to project a pattern image on a mask (or a reticle) onto a photosensitive substrate (a wafer or a glass plate coated with a photoresist, or the like) through a projection optical system. There is a recently proposed method of measuring a pupil transmittance distribution of the projection optical system in a mounted state on the exposure apparatus on an as-needed basis, in order to improve the contrast of the pattern image formed through the projection optical system (e.g., cf. Kazuya Sato et al., "Measurement of transmittance variation of projection lenses depending on the light paths using a grating-pinhole mask,"Proceedings of SPIE Vol. 4346, pp. 379-386, 2001).

SUMMARY

According to an embodiment of the invention, a measuring method measures a pupil transmittance distribution of an optical system to be examined. An aspect of the measuring method comprises a beam supplying, a beam diffracting, a region passing, an intensity measuring, and a transmittance ratio calculating. The beam supplying is to supply a first beam to a predetermined position on a first surface in an optical Fourier transform relation with a pupil of the optical system to be examined. The beam diffracting is to impart a first phase value to light passing through a first phase region on the first surface and to impart a second phase value different from the first phase value to light passing through a second phase region adjacent to the first phase region, thereby diffracting the first beam. The region passing is to let a +first-order diffracted beam of the first beam, which is generated through diffraction of the first beam, pass through a first pupil partial region in an effective region of the pupil, and to let a −first-order diffracted beam of the first beam, which is generated through diffraction of the first beam, pass through a second pupil partial region apart from the first pupil partial region in the effective region. The intensity measuring is to measure an intensity of the +first-order diffracted beam of the first beam, which has traveled via the first pupil partial region and the optical system to be examined, and an intensity of the −first-order diffracted beam of the first beam, which has traveled via the second pupil partial region and the optical system to be examined. The transmittance ratio calculating is to calculate a ratio of a pupil transmittance in the first pupil partial region and a pupil transmittance in the second pupil partial region, based on a measured value of the intensity of the +first-order diffracted beam of the first beam and a measured value of the intensity of the −first-order diffracted beam of the first beam.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments according to the Invention will be described hereinafter with reference to the accompanying drawings.

Figure 1:
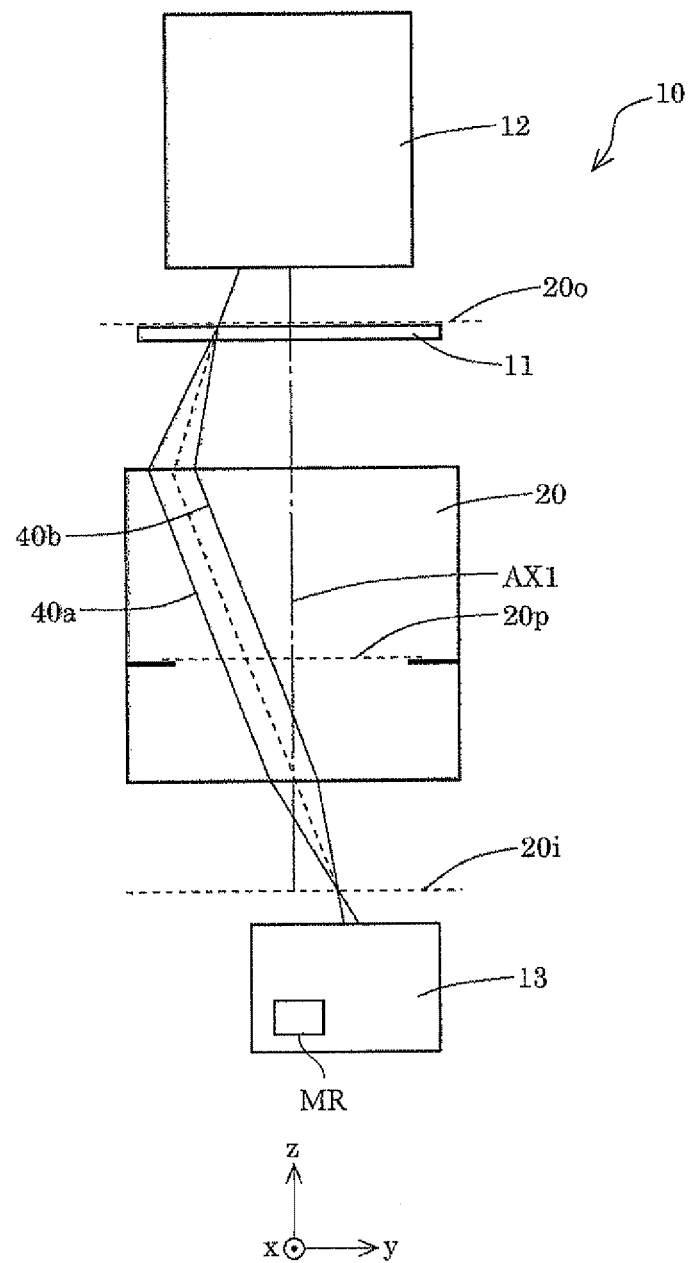
FIG. 1 is an exemplary drawing schematically showing a configuration of a measuring apparatus for measurement of a pupil transmittance distribution according to the first embodiment.

FIG. 1 is a drawing schematically showing a configuration of a measuring apparatus for pupil transmittance distribution according to the first embodiment. Specifically, the first embodiment is an application to a measuring apparatus 10 for measuring a pupil transmittance distribution of imaging optical system 20 as an optical system to be examined. In FIG. 1, the z-axis is set along a direction of a normal to an image plane 20$i$ of the imaging optical system 20, the y-axis along a direction parallel to the plane of FIG. 1 on the image plane 20$i$, and the x-axis along a direction normal to the plane of FIG. 1 on the image plane 20$i$. The "pupil transmittance distribution of an optical system" means a transmittance distribution of a transmittance filter under the condition that by considering light passing an arbitrary position in an effective region of a pupil and defining a ratio of the intensity before incidence and the intensity after emission of the light, the ratio in an ideal optical state in which the transmittance filter is located at the pupil position is coincident with that in a state of an actual optical system.

Figure 2:
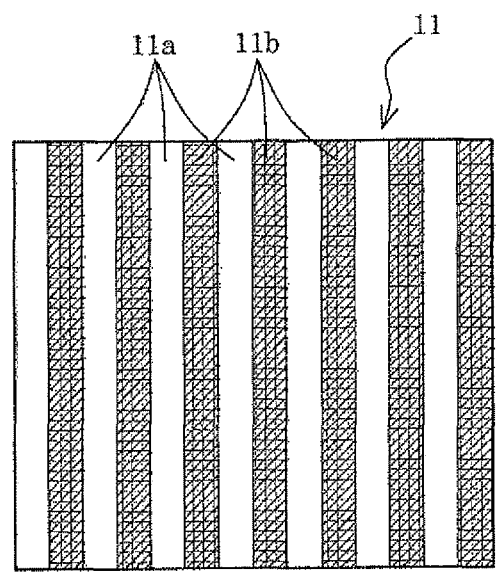
FIG. 2 is an exemplary drawing schematically showing a configuration of a phase type diffraction grating shown in FIG. 1.
Figure 2:
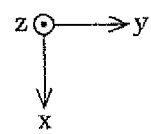

The measuring apparatus 10 of the first embodiment is provided with a phase type diffraction grating 11 which can be mounted on an object plane 20$o$ of the imaging optical system 20, an illumination optical system 12 which makes a measurement beam incident at a predetermined position on the object plane 20$o$ (and, therefore, at a predetermined position on the diffraction grating 11), and a measuring unit 13 which measures the intensity of the measurement beam having traveled through the imaging optical system 20. The diffraction grating 11, as shown in FIG. 2, has a form in which first phase regions 11$a$ to impart a first phase value to transmitted light and second phase regions 11$b$ to impart a second phase value different by $\pi$ from the first phase value, to transmitted light are alternately arranged along one direction.

Figure 3:
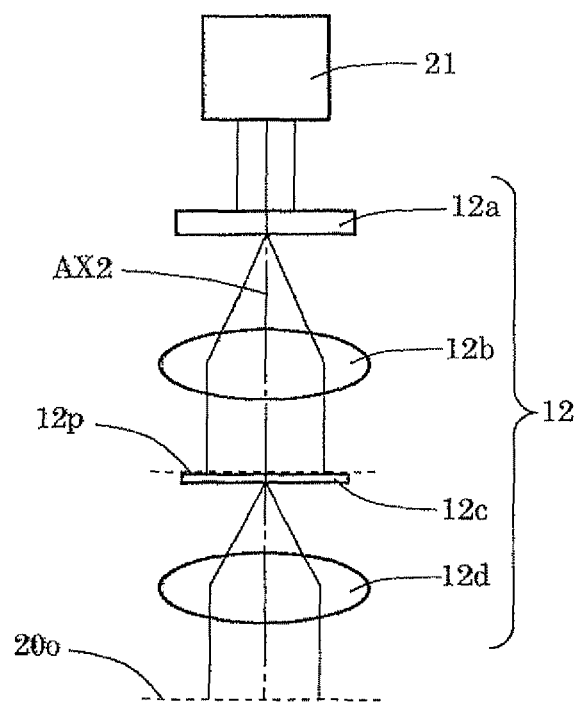
FIG. 3 is an exemplary drawing schematically showing an internal configuration of an illumination optical system shown in FIG. 1.

It is assumed in the description hereinafter that the diffraction grating 11 is mounted so that the pitch direction of the phase regions 11$a$, 11$b$ coincides with the y-direction and so that a diffraction optical surface thereof coincides with the object plane 20$o$. It is also assumed that the imaging optical system 20 and the illumination optical system 12 are coaxially arranged so that their optical axes AX1 and AX2 (cf. FIG. 3) are aligned along a straight line extending in the z-direction. The illumination optical system 12, as shown in FIG. 3, is provided with a spatial light modulator 12$a$ and a first relay optical system 12$b$ which form a predetermined light intensity distribution on an illumination pupil 12$p$, based on light from a light source 21, an aperture stop 12$c$ which can be inserted into or retracted from an illumination optical path at the illumination pupil 12$p$, and a second relay optical system 12$d$ which guides light having passed through the aperture stop 12$c$, to the object plane 20$o$ of the imaging optical system 20.

The light source 21 supplies, for example, the light to be used in the imaging optical system 20. The spatial light modulator 12$a$ applicable herein is a diffractive optical element, a mirror array, or the like. The mirror array is a spatial light modulator with a plurality of mirror elements individually controllable as arrayed in a predetermined plane, and its configuration and action are disclosed, for example, in European Patent Application Laid-Open No. 779530, U.S. Pat. Nos. 6,900,915, 7,095,546, and Japanese Patent Application Laid-Open No. 2006-113437. The illumination pupil 12$p$ is in an optical Fourier transform relation with the object plane 20$o$ of the imaging optical system 20 and is located at a position optically conjugate with a pupil 20$p$ of the imaging optical system 20. The disclosures of European Patent Application Laid-Open No. 779530, U.S. Pat. Nos. 6,900,915, 7,095,546, and Japanese Patent Application Laid-Open No. 2006-113437 are incorporated herein by reference.

Figure 4:
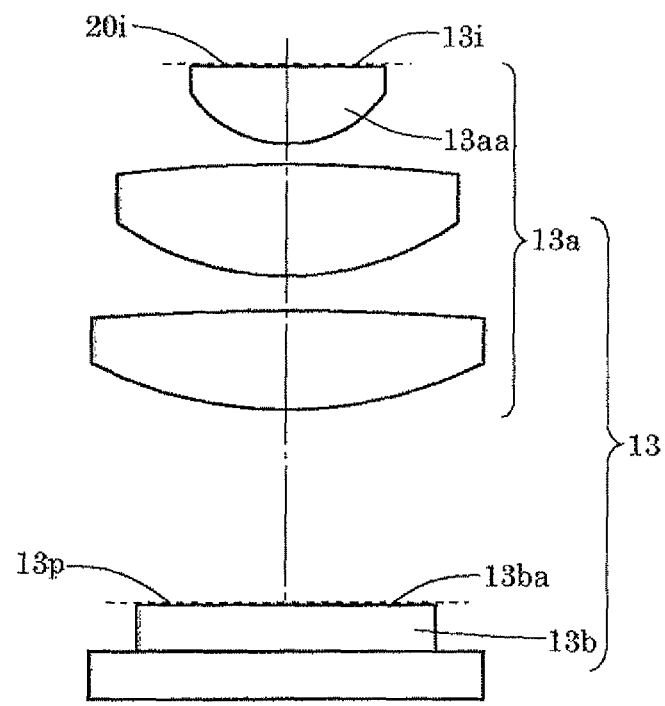
FIG. 4 is an exemplary drawing schematically showing an internal configuration of a measuring unit shown in FIG. 1.

The measuring unit 13, as shown in FIG. 4, is provided with an objective optical system 13$a$ which forms a plane 13$p$ in an optical Fourier transform relation with the image plane 20$i$ of the imaging optical system 20, and a photoelectric detector 13$b$ which has a detection surface 13$ba$ arranged along the plane 13$p$, and is configured so as to be integrally movable along the xy plane. Namely, the objective optical system 13$a$ is arranged in an optical path between the plane 13$p$ optically conjugate with the pupil 20$p$ of the imaging optical system 20, and the imaging optical system 20, and the detection surface 13$ba$ of the photoelectric detector 13$b$ is arranged along the pupil plane 13$p$ of the objective optical system 13$a$.

The photoelectric detector 13b applicable herein is, for example, a solid-state image sensing device such as a CCD image sensor or CMOS image sensor, an image pickup tube, or the like.

Figure 5:
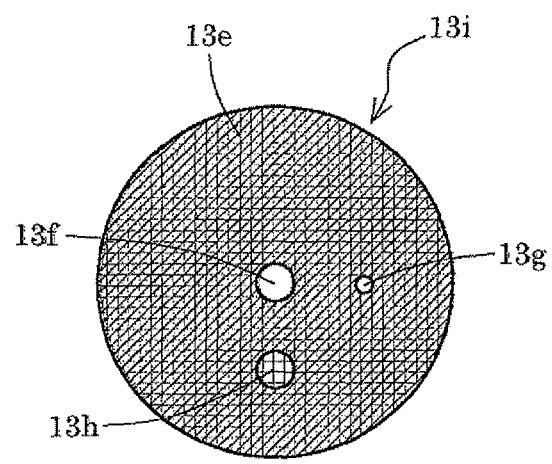
FIG. 5 is an exemplary drawing showing a state in which a calibration phase diffraction grating and others are formed on an entrance plane of an objective optical system in the measuring unit.
Figure 5:
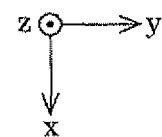

A planoconvex lens 13aa with a plane along the image plane 20i of the imaging optical system 20 is arranged at a position nearest to the imaging optical system 20, in the objective optical system 13a. Formed on the entrance plane 13i of the planoconvex lens 13aa are, as shown in FIG. 5, a shield portion 13e, for example, made of chromium or chromium oxide, a measurement aperture 13f, a calibration pinhole 13g for calibration of wavefront aberration measurement result, and a calibration phase diffraction grating 13h for calibration of pupil transmittance distribution measurement result. The portions except for the calibration phase diffraction grating 13h in the configuration of the measuring unit 13 are disclosed, for example, in U.S. patent application Laid-Open No. 2008/0030707A1. The disclosure of U.S. Patent Application Laid-Open No. 2008/0030707A1 is incorporated herein by reference. The measuring unit 13 may be a processing unit (computer) with a recording medium such as a memory MR, and this memory MR stores a program for letting the processing unit execute a measuring method, and controlling methods of exposure apparatus and the spatial modulator 12a according to the present embodiment.

Figure 6:
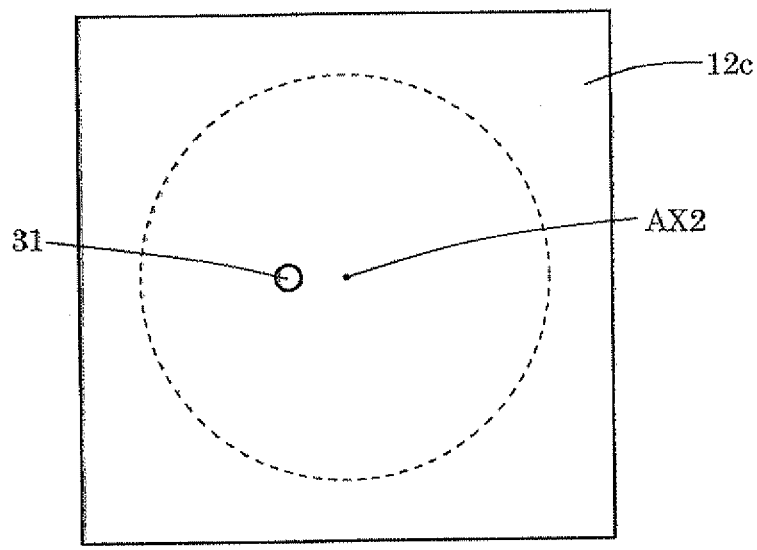
FIG. 6 is an exemplary drawing showing a state in which an aperture stop is arranged at a position of an illumination pupil.
Figure 6:
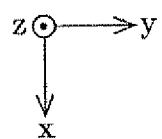

For facilitating understanding of action of the measuring apparatus 10, a case using an aperture stop 12c with a single aperture 31 of a circular shape as shown in FIG. 6 will be considered below as the simplest example. In FIG. 6, a circle indicated by a dashed line around the optical axis AX2 as a center represents an effective region on the illumination pupil 12p. The aperture stop 12c is mounted so that the center of the aperture 31 is located apart in the −y-direction from the optical axis AX2, and a beam is incident to a required region including the aperture 31 on the aperture stop 12c. In this case, the aperture stop 12c functions as a localized beam forming unit which forms a circular localized beam with a light intensity distribution localized at a position apart from the optical axis AX2 on the illumination pupil 12p optically conjugate with the pupil 20p of the imaging optical system 20.

A beam through the aperture 31 of the aperture stop 12c travels through the second relay optical system 12d to be incident as a beam inclined relative to the optical axis AX1 of the imaging optical system 20 (and, therefore, relative to the optical axis AX2 of the illumination optical system 12), to a predetermined position on the diffraction grating 11 (and, therefore, to a predetermined position on the object plane 20o of the imaging optical system 20). The position of incidence of the oblique beam to the diffraction grating 11 is variably determined, for example, by a field stop (not shown) located at or near a position optically conjugate with the object plane 20o in the optical path of the second relay optical system 12d consisting of a plurality of lenses or by a field stop (not shown) located at a position immediately in front of the object plane 20o.

Figure 7:
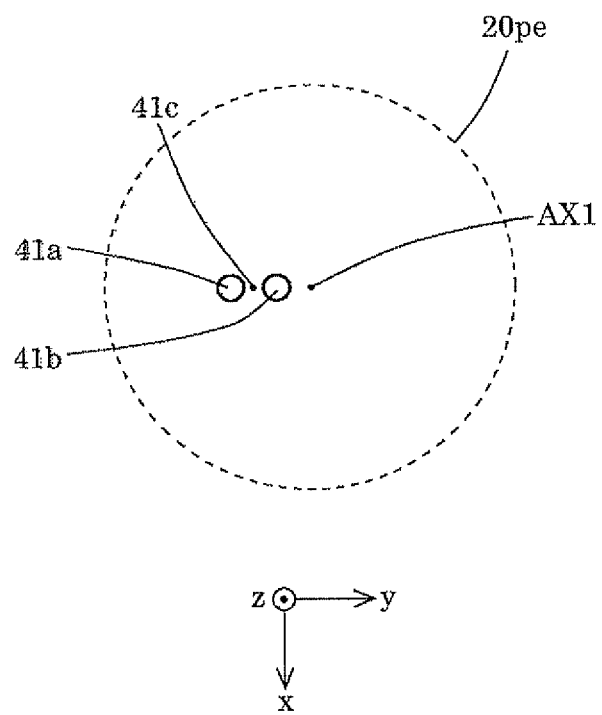
FIG. 7 is an exemplary drawing showing a pair of pupil partial regions where ±first-order diffracted beams generated through a diffraction grating pass through a pupil of an imaging optical system.

For simplicity of description, it is assumed below that the illumination pupil 12p of the illumination optical system 12 and the pupil 20p of the imaging optical system 20 are in a conjugate relation to form an erect image of the illumination pupil 12p on the pupil 20p with respect to the x-direction and the y-direction. With reference to FIGS. 1 and 7, of diffracted light generated by oblique incidence to the diffraction grating 11, a +first-order diffracted beam 40a (or 40b) passes a pupil partial region 41a in an effective region 20pe of the pupil 20p of the imaging optical system 20 and a −first-order diffracted beam 40b (or 40a) passes a pupil partial region 41b apart from the pupil partial region 41a in the pupil effective region 20pe, each of which is emitted from the imaging optical system 20. The pupil partial regions 41a and 41b have a circular shape as the aperture 31 does, and have the same size.

The pupil partial regions 41a and 41b are located at positions symmetric with respect to a point 41c on a straight line passing the optical axis AX1 and extending in the y-direction on the pupil effective region 20pe. The point 41c herein is a center of a region which a zero-order beam passes on the pupil 20p if the zero-order beam is generated through the diffraction grating 11 (which is indicated by a dashed line in FIG. 1). Namely, the center position 41c between the pupil partial regions 41a and 41b is dependent upon the position of the aperture 31 of the aperture stop 12c. The size of the pupil partial regions 41a and 41b is dependent upon the size of the aperture 31 of the aperture stop 12c. The center-center distance between the pupil partial regions 41a and 41b is dependent upon the pitch of the phase regions 11a, 11b in the diffraction grating 11.

With reference to FIGS. 1, 3, and 5, the +first-order diffracted beam 40a through the pupil partial region 41a and imaging optical system 20 and the −first-order diffracted beam 40b through the pupil partial region 41b and imaging optical system 20 travel through the measurement aperture 13f of the measuring unit 13 to enter the objective optical system 13a. The first-order diffracted beams 40a, 40b through the objective optical system 13a impinge on the detection surface 13ba arranged on the pupil plane 13p of the objective optical system 13a, to be detected by the photoelectric detector 13b. For clarity of the drawing, FIG. 1 shows a state in which the measuring unit 13 is arranged with a space below the image plane 20i of the imaging optical system 20.

It is assumed below for simplicity of description that the intensity of the +first-order diffracted beam 40a and the intensity of the −first-order diffracted beam 40b generated through the diffraction grating 11 are identical with each other and that a ratio of the intensities of the +first-order diffracted beam 40a and the −first-order diffracted beam 40b at the image plane 20i of the imaging optical system 20 is coincident with a ratio of the intensities of the +first-order diffracted beam 40a and the −first-order diffracted beam 40b detected on the detection surface 13ba of the measuring unit 13. In other words, it is assumed that the measuring unit 13 is able to accurately measure the intensity ratio of the +first-order diffracted beam 40a and the −first-order diffracted beam 40b at the image plane 20i of the imaging optical system 20, without being affected by a pupil transmittance distribution of the objective optical system 13a or the like.

In this case, the measuring apparatus 10 calculates a ratio of a pupil transmittance in the pupil partial region 41a and a pupil transmittance in the pupil partial region 41b, based on a measured value of the intensity of the +first-order diffracted beam 40a and a measured value of the intensity of the −first-order diffracted beam 40b, and measures a pupil transmittance distribution of the imaging optical system 20 about the pupil partial regions 41a and 41b eventually. The pupil transmittance distribution to be measured by the measuring apparatus 10 is not a distribution of absolute values of pupil transmittances in the pupil effective region 20pe, but relative ratio information of pupil transmittance distribution, e.g., a normalized distribution with the pupil transmittance of 1 at the center of the pupil effective region 20pe (or at the position of the optical axis AX1).

For measuring the pupil transmittance distribution of the imaging optical system 20 about the pair of pupil partial regions 41a and 41b spaced from each other, the measuring apparatus 10 is configured so that the aperture 31 is arranged at a position optically corresponding to the midpoint 41c in a line segment connecting the center of the pupil partial region 41a and the center of the pupil partial region 41b. This means that a set of ratios of pupil transmittances in any paired pupil partial regions are obtained by repeating the measurement with the measuring unit 13 with step movement of the aperture stop 12c along the xy plane so as to locate the aperture 31 at a position corresponding to a pair of pupil partial regions to be measured in the pupil effective region 20pe and, therefore, that a pupil transmittance distribution of the imaging optical system 20 can be measured about a desired number of pupil partial regions according to a desired distribution.

Specifically, the relative information of pupil transmittances among a desired number of pupil partial regions distributed across the entire pupil effective region 20pe is obtained by successively determining the ratio of pupil transmittances in any pair of pupil partial regions while performing step movement of the aperture stop 12c along the xy plane and thereby changing the angle of incidence of the measurement light to the diffraction grating 11. Then a two-dimensional pupil transmittance distribution of the imaging optical system 20 is directly obtained as a functional distribution, for example, by the Zernike fitting process for a distribution of relative values of these discrete pupil transmittances in the pupil effective region 20pe. For the technique of obtaining the functional distribution by the Zernike fitting process for the distribution of discrete measured values, reference can be made to the ordinary Zernike fitting process for wavefront aberration, and it can be calculated by the linear least-squares method.

In the measuring apparatus 10, the diffraction grating 11 also generates zero-order light, ±third-order diffracted light, ±fifth-order diffracted light, etc. due to manufacturing error of the diffraction grating. In this case, the ±third-order diffracted light, ±fifth-order diffracted light, etc. should be excluded from the measurement and set away from the ±first-order diffracted beams of measurement targets on the pupil 20p of the imaging optical system 20. In practice, however, the intensity of the ±fifth-order diffracted light (and higher-order diffracted light) is negligibly smaller than the intensity of the ±first-order diffracted beams of measurement targets. A setting technique for avoiding overlapping of the ±first-order diffracted beams with the zero-order light and ±third-order diffracted light on the pupil of the optical system to be examined will be specifically described in the second embodiment.

In the measuring apparatus 10, as described above, the diffraction grating 11 can be mounted on the object plane 20o in the optical Fourier transform relation with the pupil 20p of the imaging optical system 20 as an optical system to be examined. The illumination optical system 12 makes the inclined beam relative to the optical axis AX1 of the imaging optical system 20 (provided, however, that inclusion of a normally incident beam is not excluded) incident to the predetermined position on the object plane 20o so that the +first-order diffracted beam 40a generated through the diffraction grating 11 on the object plane 20o passes through the pupil partial region 41a in the pupil effective region 20pe and so that the −first-order diffracted beam 40b generated through the diffraction grating 11 passes through the pupil partial region 41b apart from the pupil partial region 41a in the pupil effective region 20pe. The measuring unit 13 measures the intensity of the +first-order diffracted beam 40a having traveled via the pupil partial region 41a and the imaging optical system 20 and the intensity of the −first-order diffracted beam 40b having traveled via the pupil partial region 41b and the imaging optical system 20.

Since the measuring apparatus 10 of the first embodiment employs the phase diffraction grating 11 in which the two types of phase regions 11a and 11b are alternately arranged, the intensities of the ±first-order diffracted light components as measurement targets among the diffracted beams generated through the diffraction grating 11 are equal to each other. As a consequence, high-accuracy detection of each diffracted light component can be performed using a relatively narrow dynamic range by the photoelectric detector 13b of the measuring unit 13 and therefore the pupil transmittance distribution of the imaging optical system 20 can be measured with high accuracy. Since the measuring apparatus uses the phase diffraction grating 11 in which the two types of phase regions 11a and 11b with the phase difference of π are alternately arranged, it is able to perform high-accuracy detection of each component, without affecting the measurement of the intensities of the ±first-order diffracted light components by generation of the zero-order light which is an unmeasured beam.

Furthermore, the measuring apparatus is able to quickly measure the pupil transmittance distribution of the imaging optical system 20 with a relatively low load by simply performing the step movement of the aperture stop 12c with the single aperture 31 a required number of times along the xy plane, without need for changing the posture of the diffraction grating 11 (to change the pitch direction) or for replacing the diffraction grating 11 with another diffraction grating having a different property (e.g., a different pitch). In other words, the measuring apparatus is able to quickly measure the pupil transmittance distribution of the imaging optical system 20 with a relatively low load, by simply changing the angle of incidence of the measurement light to the diffraction grating 11 by the step movement of the aperture 31 of the aperture stop 12c along the xy plane in a state in which the diffraction grating 11 is stationarily set.

It is important in the measuring apparatus 10 of the first embodiment that the pupil partial regions 41a and 41b be separated from each other in order to accurately detect the intensities of the respective diffracted light components, and it is also important that the size of the pupil partial regions 41a, 41b (and, therefore, the size of the aperture 31) be controlled at some small level in order to accurately measure the pupil transmittance distribution. Namely, since the center-center distance between the pair of pupil partial regions 41a, 41b optically corresponding to the aperture 31 of the aperture stop 12c does not have to be set excessively large, the pitch of the phase regions 11a and 11b in the diffraction grating 11 does not have to be set excessively small, which eventually facilitates manufacture of the diffraction grating 11.

Figure 8:
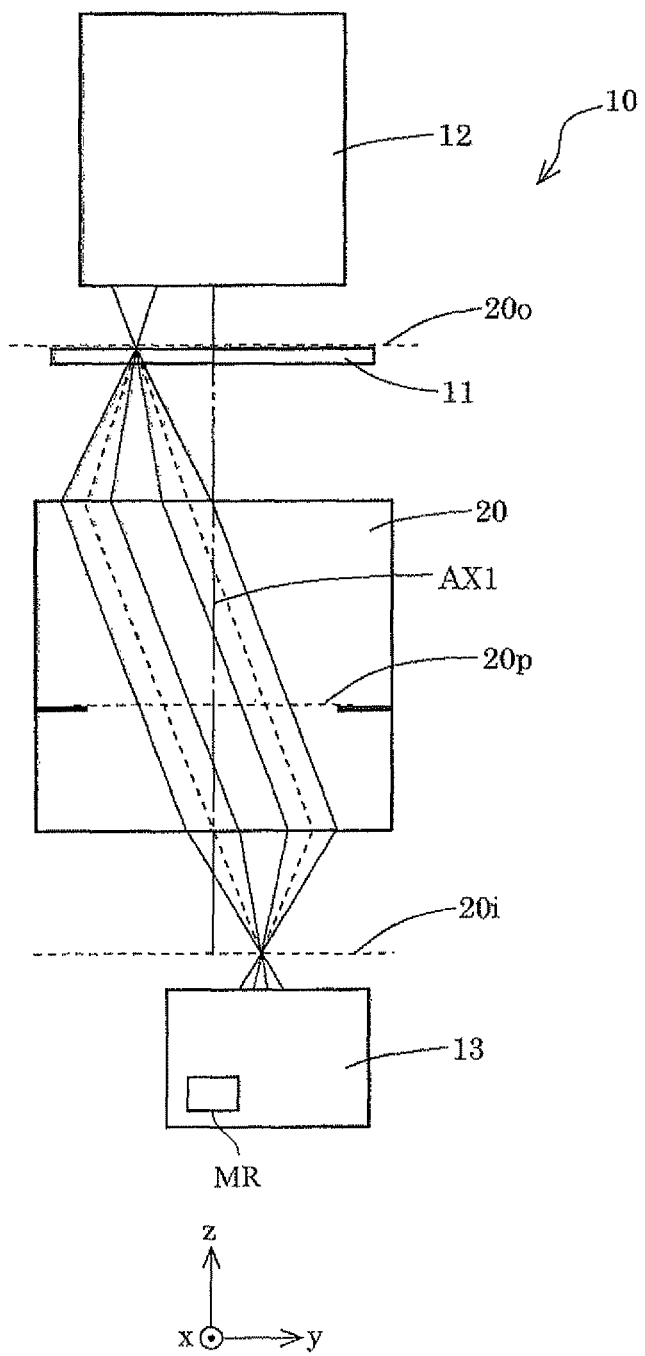
FIG. 8 is an exemplary drawing showing a state in which a pair of beams are obliquely incident simultaneously to a predetermined position on a diffraction grating to generate first ±first-order diffracted beams and second ±first-order diffracted beams.

In the description about the above-described first embodiment, the measurement by the measuring unit 13 is repeatedly carried out with the step movement of the aperture stop 12c provided with the single aperture 31. However, without having to be limited to this, it is also possible to use an aperture stop provided with a plurality of apertures, and use of such an aperture stop reduces the number of step movements and, therefore, the number of measurements by the measuring unit, thereby permitting quicker measurement of the pupil transmittance distribution of the imaging optical system 20. As an example, FIG. 8 shows a setup wherein a first beam and a second beam through a pair of apertures arranged in symmetry in the y-direction with the optical axis AX2 in between on the illumination pupil 12p are simultaneously obliquely incident to a predetermined position on the diffraction grating 11 to generate first ±first-order diffracted beams from the first beam and second ±first-order diffracted beams from the second beam.

It is also possible to adopt another setup using an aperture stop 12c with a plurality of apertures arranged according to a required distribution, wherein beams as many as the apertures are simultaneously supplied to a predetermined position on the diffraction grating 11 and the pupil transmittance distribution of the imaging optical system 20 is collectively measured based on ±first-order diffracted beams generated from the respective beams. In this case, there is no need for the step movement of the aperture stop 12c and the measurement by the measuring unit 13 is only one measurement, thereby enabling the quickest measurement of the pupil transmittance distribution. A technique for collectively measuring the pupil transmittance distribution of the optical system to be examined, using the aperture stop with a plurality of apertures will be specifically described in the second embodiment.

In the description about the above-described first embodiment, the aperture stop 12c functions as a localized beam forming unit which forms the circular localized beam with the light intensity distribution localized at the position apart from the optical axis AX2 on the illumination pupil 12p. However, without having to be limited to this, a variety of forms can be contemplated as to the number, shape, size, position, etc. of the localized beam or beams formed on the illumination pupil. Specifically, it is possible, for example, to provide an aperture of a polygonal shape in order to form a localized beam of a polygonal shape, or to arrange an aperture at the position of the optical axis AX2 as well so as to include a localized beam localized at the position of the optical axis AX2.

Instead of the aperture 12c or in addition to the aperture stop 12c, the spatial light modulator 12a may be arranged to function as a localized beam forming unit. In this case, the spatial light modulator 12a as a localized beam forming unit provides an angle distribution to the beam traveling toward the illumination pupil 12p, in order to form at least one light intensity distribution localized at a position apart from the optical axis AX2 on the illumination pupil 12p. Specifically, the spatial light modulator 12a applicable may be only diffractive optical elements, only a mirror array, or a combination of a diffractive optical element and a mirror array.

In the case using only the diffractive optical elements, it is necessary to prepare a plurality of diffractive optical elements with different properties and to set a required diffractive optical element in the illumination optical path according to an angle of incidence necessary for the beam incident to the diffraction grating 11. In the case using only the mirror array, it is sufficient that a plurality of mirror elements be individually controlled according to an angle of incidence necessary for the beam incident to the diffraction grating 11. Specifically, by individually controlling the plurality of mirror elements in the mirror array, one or more beams may be made successively incident to the diffraction grating 11 with change in the angle of incidence, or a plurality of beams with various angles of incidence may be made simultaneously incident to the diffraction grating 11.

In the description about the above-described first embodiment, the diffraction grating 11 used is the phase diffraction grating having the form in which the two types of phase regions 11a and 11b with the phase difference of $\pi$ are alternately arranged along one direction. However, without having to be limited to this, a variety of forms can be contemplated as to the specific configuration of the diffraction grating. For example, it is possible to use a diffraction grating in a form in which two types of phase regions with an appropriate phase difference except for $\pi$ are alternately arranged along one direction. In this case, the zero-order light is generated, but it is possible to adopt such a setup that the zero-order light is excluded from the measurement and that the zero-order light does not overlap with the ±first-order diffracted beams on the pupil 20p of the imaging optical system 20.

It is also possible, for example, to use a diffraction grating wherein two types of rectangular phase regions are arranged so as to form a check flag pattern, i.e., a diffraction grating in a form wherein two types of rectangular phase regions are arranged in a checkered pattern. In this case, a pair of +first-order diffracted beams and a pair of −first-order diffracted beams are generated from a beam incident to the diffraction grating. A technique for measuring the pupil transmittance distribution of the optical system to be examined, using a diffraction grating in a form in which two types of rectangular phase regions with the phase difference of a are arranged in a checkered pattern will be specifically described in the second embodiment.

Furthermore, a bright/dark type diffraction grating may also be used instead of the phase type diffraction grating 11. In this case, the pupil transmittance distribution of the optical system to be examined can be quickly measured with a relatively low load while changing the angle of incidence of the measurement light incident to the diffraction grating stationarily mounted at the position in the optical Fourier transform relation with the pupil of the optical system to be examined. Namely, there is no need for preparing a plurality of diffraction gratings with different pitches of bright/dark patterns and repeating the measurement with each diffraction grating while changing the pitch direction.

In the description about the above-described first embodiment, it is assumed that the measuring unit 13 can accurately measure the intensity ratio of the +first-order diffracted beam 40a and the −first-order diffracted beam 40b, without being affected by the pupil transmittance distribution of the objective optical system 13a. However, if the influence of the pupil transmittance distribution of the objective optical system 13a is not so small as negligible, the following technique can be applied to detect an error of the measurement result due to the pupil transmittance distribution of the objective optical system 13a and calibrate the measurement result of the pupil transmittance distribution of the imaging optical system 20 therewith.

Figure 9:
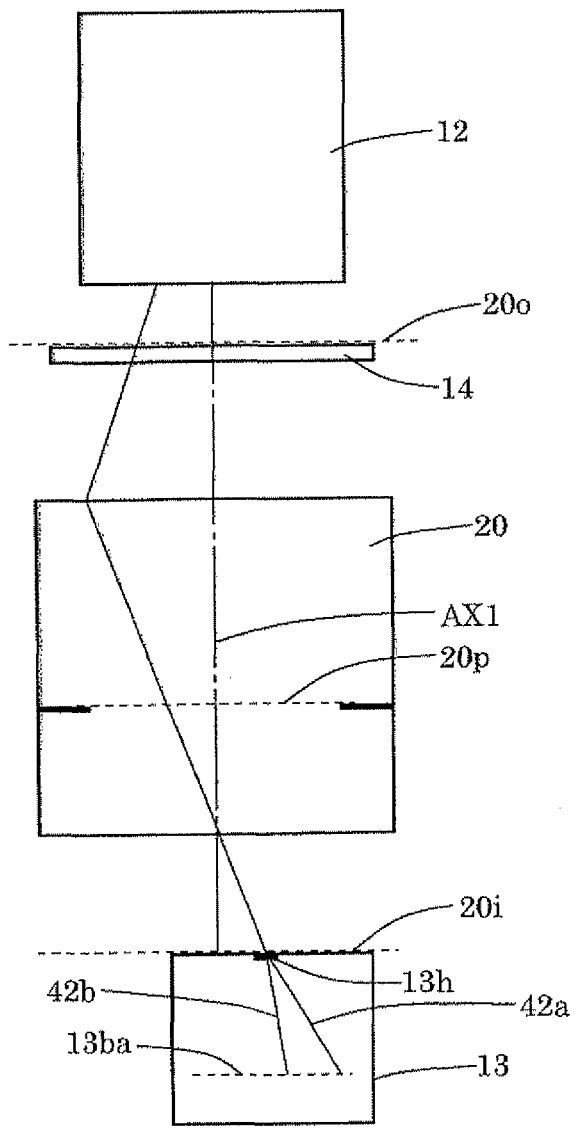
FIG. 9 is an exemplary drawing for explaining a technique for detecting an error of the measurement result caused by a pupil transmittance distribution of the objective optical system in the measuring unit.

For performing the operation to detect the error of the measurement result due to the pupil transmittance distribution of the objective optical system 13a (i.e., a calibration operation of the measuring unit 13), as shown in FIG. 9, a plane-parallel plate 14 with the same thickness and same refractive index as the diffraction grating 11, for example, is mounted instead of the diffraction grating 11 on the object plane 20o of the imaging optical system 20. Then the measuring unit 13 is positioned along the xy plane so that a beam from the aperture 31 having entered a predetermined position on the plane-parallel plate 14 (the same position as the position of incidence of the measurement beam to the diffraction grating 11) and having traveled through the imaging optical system 20 passes the calibration phase diffraction grating 13h. The calibration phase diffraction grating 13h has a form in which two types of phase regions with the phase difference of $\pi$ are alternately arranged along the y-direction, as the diffraction grating 11 does.

In this case, for example, the calibration beam (beam not diffracted by the plane-parallel plate 14) having been emitted from the aperture 31 of the aperture stop 12c mounted as shown in FIG. 6 and having passed through the plane-parallel plate 14 and imaging optical system 20 is diffracted by the calibration phase diffraction grating 13h. A +first-order diffracted beam 42a (or 42b) and a −first-order diffracted beam 42b (or 42a) generated through the calibration phase diffraction grating 13h travel through the objective optical system 13a to impinge on the detection surface 13ba of the photoelectric detector 13 arranged on the pupil plane 13p of the objective optical system 13a.

The measuring unit 13 measures the intensity of the +first-order diffracted beam 42a and the intensity of the −first-order diffracted beam 42b. The calibration phase diffraction grating 13h is configured so as to make the +first-order diffracted beam 42a corresponding to the +first-order diffracted beam 40a described with reference to FIG. 1 and make the −first-order diffracted beam 42b corresponding to the −first-order diffracted beam 40b. As a result, the measuring unit 13 calibrates the calculation result of the ratio of pupil transmittances in the pair of pupil partial regions 41a, 41b, using the measured values of intensities of the +first-order diffracted beam 42a and the −first-order diffracted beam 42b. Furthermore, the measurement by the measuring unit 13 is repeated with step movement of the aperture stop 12c with the aperture 31 along the xy plane, thereby calibrating the calculation result of the ratio of pupil transmittances in any pair of pupil partial regions in the pupil effective region 20pe of the imaging optical system 20. In this manner, the measuring apparatus is able to detect the error of the measurement result due to the pupil transmittance distribution of the objective optical system 13a and calibrate the measurement result of the pupil transmittance distribution of the imaging optical system 20 therewith.

When the aperture stop used is one provided with a plurality of apertures, it can reduce the number of step movements thereof and therefore, the number of measurements by the measuring unit, thereby enabling quicker detection of the error of the measurement result due to the pupil transmittance distribution of the objective optical system 13a. In another case where the aperture stop used is one with a plurality of apertures arranged according to a required distribution, the measuring apparatus is able to simultaneously supply beams as may as the apertures to a predetermined position on the plane-parallel plate 14 and to collectively detect the error of the measurement result due to the pupil transmittance distribution of the objective optical system 13a on the basis of the ±first-order diffracted beams generated through the calibration phase diffraction grating 13h from the respective beams.

In accordance with the configuration of the diffraction grating 11 used in the measurement of the pupil transmittance distribution of the imaging optical system 20, the calibration phase diffraction grating 13h to be used can be a diffraction grating in a form in which two types of phase regions with an appropriate phase difference except for π, for example, are alternately arranged along one direction. The calibration phase diffraction grating 13h also applicable herein is a diffraction grating in which, for example, two types of rectangular phase regions are arranged so as to form a check flag pattern, i.e., a diffraction grating in a form in which two types of rectangular phase regions are arranged in a checkered pattern.

Figure 10:
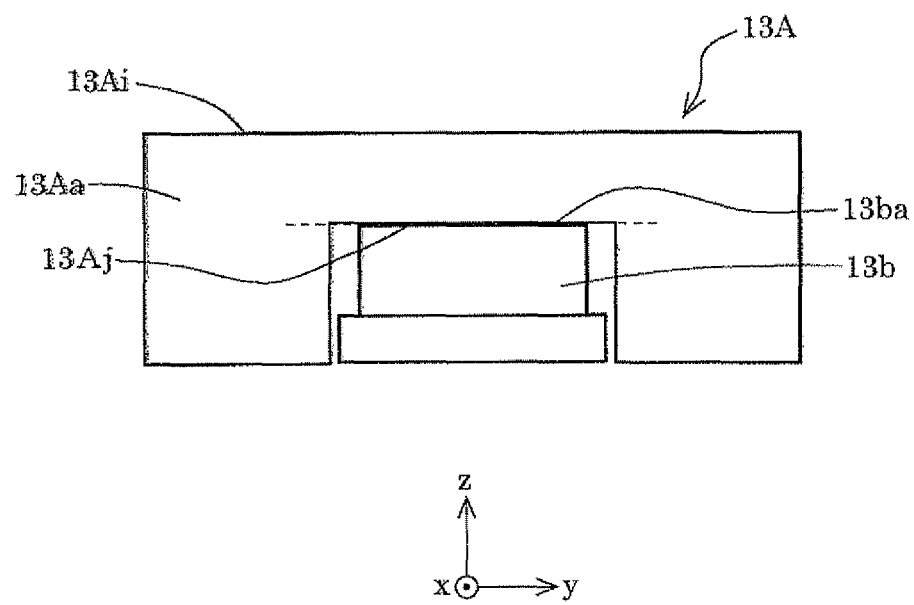
FIG. 10 is an exemplary drawing schematically showing an internal configuration of a PDI/LDI type measuring unit.

In the description about the above-described first embodiment, the measuring unit 13 has the objective optical system (measurement optical system) 13a, and the photoelectric detector 13b which detects the ±first-order diffracted light components through photoelectric conversion on the pupil plane (plane optically conjugate with the pupil 20p of the imaging optical system 20) 13p of the objective optical system 13a. However, a variety of forms can be contemplated as to the specific configuration of the measuring unit. For example, as shown in FIG. 10, it is also possible to use a measuring unit 13A employing a PDI (Point Diffraction Interferometer) or LDI (Line Diffraction Interferometer).

Figure 11:
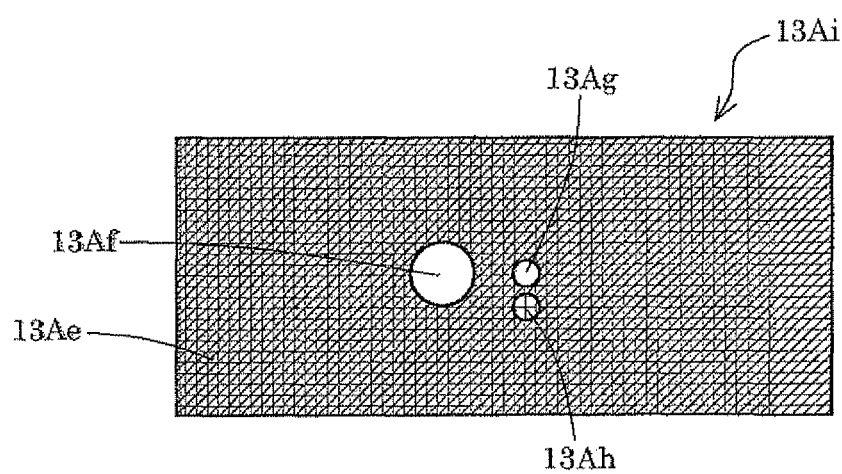
FIG. 11 is an exemplary drawing showing a state in which a calibration phase diffraction grating and others are formed on an entrance plane of an optically transparent substrate in the measuring unit of FIG. 10.
Figure 11:
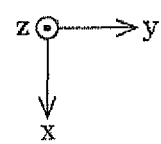

The PDI/LDI type measuring unit 13A as described above is provided with an optically transparent substrate 13Aa having a planar entrance surface 13Ai, and a photoelectric detector 13b having a detection surface 13ba arranged in contact with a planar exit surface 13Aj of the optically transparent substrate 13Aa. Formed on the entrance plane 13Ai of the optically transparent substrate 13Aa, as shown in FIG. 11, are a shield portion 13Ae, for example, made of chromium or chromium oxide, a measurement aperture 13Af, a pinhole 13Ag for generation of spherical reference wave, and a calibration phase diffraction grating 13Ah for calibration of the pupil transmittance distribution measurement result. The portions except for the calibration phase diffraction grating 13Ah in the configuration of the measuring unit 13A are disclosed, for example, in FIG. 3 of U.S. patent application Laid-Open No. 2008/0252876A1.

The measuring unit 13A causes interference between a wavefront from the optical system to be examined, passing through the measurement aperture 13Af, and a spherical wave appearing from the pinhole 13Ag for generation of spherical reference wave, to four interference fringes on the detection surface 13ba of the photoelectric detector 13b. The interference fringes contain information of wavefront aberration of the optical system to be examined. If the measuring unit is arranged to make light incident to the measurement aperture 13Af only, the light intensity distribution according to the pupil transmittance distribution of the optical system to be examined is formed on the detection surface 13ba. If the measuring unit is arranged to make light incident to the calibration phase diffraction grating 13Ah only, it is able to detect the error of the measurement result caused by the transmittance distribution of the optically transparent substrate 13Aa. The detection surface 13ba of the photoelectric detector 13b is in contact with the exit plane 13Aj of the optically transparent substrate 13Aa in order to receive rays with NA over 1.

Figure 12:
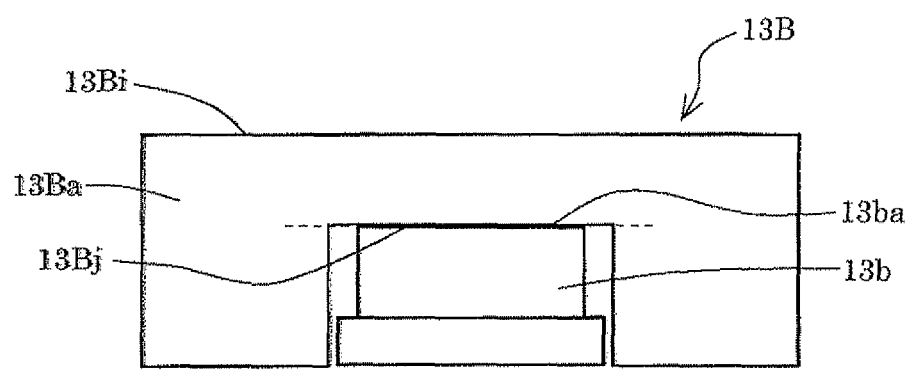
FIG. 12 is an exemplary drawing schematically showing a major configuration of a measuring unit making use of a shearing interferometer.
Figure 12:
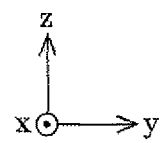
Figure 13:
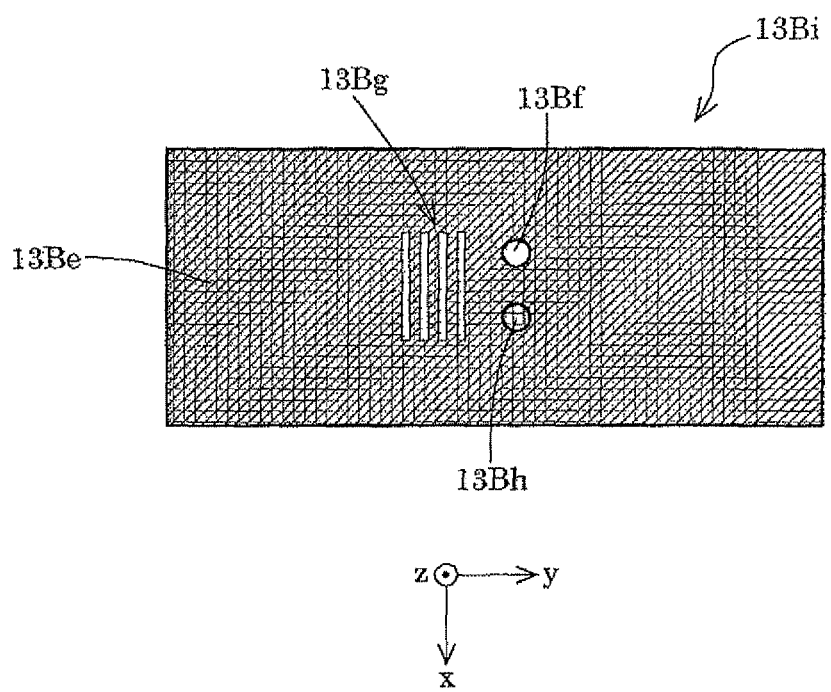
FIG. 13 is an exemplary drawing showing a state in which a calibration phase diffraction grating and others are formed on an entrance plane of an optically transparent substrate in the measuring unit of FIG. 12.

It is also possible to use a measuring unit 13B making use of a shearing interferometer, for example as shown in FIG. 12. The measuring unit 13B, similar to the measuring unit 13A, is provided with an optically transparent substrate 13Ba having a planar entrance surface 13Bi, and a photoelectric detector 13b having a detection surface 13ba arranged so as to contact a planar exit surface 13Bj of the optically transparent substrate 13Ba. Formed on the entrance plane 13Bi of the optically transparent substrate 13Ba are, as shown in FIG. 13, a shield portion 13Be, for example, made of chromium or chromium oxide, a measurement aperture 13Bf, a diffraction grating 13Bg for measurement of wavefront, and a calibration phase diffraction grating 13Bh for calibration of the pupil transmittance distribution measurement result. The portions except for the measurement aperture 13Bf and the calibration phase diffraction grating 13Bh in the configuration of the measuring unit 13B are disclosed, for example, in FIGS. 2 and 5 of U.S. patent application Laid-Open No. 2008/0252876A1 and in U.S. patent application Laid-Open Nos. 2002/0001088A1 and 2005/0078287A1. The disclosures of U.S. patent application Laid-Open No. 2008/0252876A1, U.S. patent application Laid-Open No. 2002/0001088A1, and U.S. patent application Laid-Open No. 2005/0078287A1 are incorporated herein by reference.

In the measuring unit 13B, the wavefront from the optical system to be examined is horizontally shifted by the wavefront measurement diffraction grating 13Bg and interference occurs between mutually shifted wavefronts to form interference fringes on the detection surface 13ba of the photoelectric detector 13b. The interference fringes contain information of wavefront aberration of the optical system to be examined. If the measuring unit is arranged to make light incident to the measurement aperture 13Bf only, the light intensity distribution according to the pupil transmittance distribution of the optical system to be examined is formed on the detection surface 13ba. If the measuring unit is arranged to make light incident to the calibration phase diffraction grating 13Bh only, it is able to detect the error of the measurement result caused by the transmittance distribution of the optically transparent substrate 13Ba. The detection surface 13ba of the photoelectric detector 13b is in contact with the exit plane 13Bj of the optically transparent substrate 13Ba in order to receive rays with NA over 1.

Although the description about the above-described first embodiment contains no mention of the polarization state of the measurement beam to be supplied to the diffraction grating 11, it is sometimes the case that the pupil transmittance distribution of the imaging optical system 20 as an optical system to be examined is relatively significantly dependent upon the polarization state of incident light. In this case, the measuring apparatus may be arranged, for example, to measure the pupil transmittance distribution of the imaging optical system 20 for x-directional linear polarization using the measurement beam incident in a linearly polarized state of x-directional polarization to the diffraction grating 11 and to measure the pupil transmittance distribution of the imaging optical system 20 for y-directional linear polarization using the measurement beam incident in a linearly polarized state of y-directional polarization to the diffraction grating 11.

In the description about the above-described first embodiment, the ratio of pupil transmittances in the first pair of pupil partial regions is determined based on the ±first-order diffracted beams generated through the diffraction grating 11 from the first measurement beam having the first incidence angle, and the ratio of pupil transmittances in the second pair of pupil partial regions is determined based on the ±first-order diffracted beams generated through the diffraction grating 11 from the second measurement beam having the second incidence angle. It is noted, however, that the pupil transmittance ratio in the first pair of pupil partial regions and the pupil transmittance ratio in the second pair of pupil partial regions are not always measured under the same condition, and therefore it means that the ratio of the pupil transmittances in the first pair of pupil partial regions and the pupil transmittances in the second pair of pupil partial regions is not necessarily accurately determined.

Therefore, if necessary, the measuring apparatus may be configured to make a third measurement beam incident to the predetermined position on the diffraction grating 11 before or after the measurement with the first measurement beam and the second measurement beam and then obtain a ratio of pupil transmittances in the first pair of pupil partial regions and pupil transmittances in the second pair of pupil partial regions, thereby supplementing the relative ratio information of pupil transmittance distribution on the basis of the pupil transmittance ratio. At this time, the third measurement beam is made incident at a required angle of incidence to the diffraction grating 11 so that the +first-order diffracted beam generated through the diffraction grating 11 passes a pupil partial region in a first inclusion region including the first pair of pupil partial regions and so that the −first-order diffracted beam generated through the diffraction grating 11 passes a pupil partial region in a second inclusion region including the second pair of pupil partial regions. A technique for supplementing the relative ratio information of pupil transmittance distribution as described above will be specifically described in the second embodiment.

Figure 14:
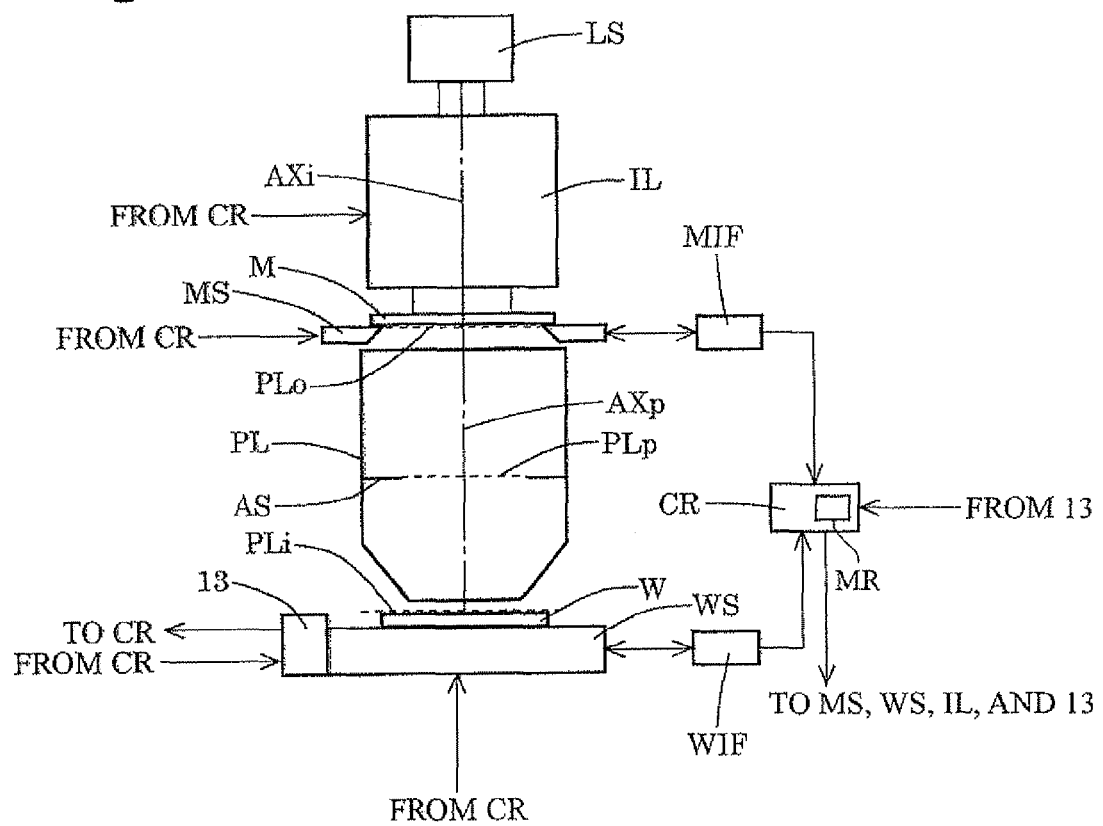
FIG. 14 is an exemplary drawing schematically showing a configuration of an exposure apparatus according to the second embodiment of the present invention.

FIG. 14 is a drawing schematically showing a configuration of an exposure apparatus according to the second embodiment. Namely, the second embodiment is an application to the exposure apparatus provided with the measuring apparatus for measuring a pupil transmittance distribution of a projection optical system PL as an optical system to be examined. In FIG. 14, the Z-axis is set along a direction of a normal to a surface (transfer surface) of a wafer W being a photosensitive substrate, the Y-axis along a direction parallel to the plane of FIG. 14 in the surface of the wafer W, and the X-axis along a direction normal to the plane of FIG. 14 in the surface of the wafer W.

Referring to FIG. 14, the exposure apparatus of the second embodiment is configured to supply exposure light (illumination light) from a light source LS. The light source LS applicable herein is, for example, an ArF excimer laser light source which supplies light at the wavelength of 193 nm, or a KrF excimer laser light source which supplies light at the wavelength of 248 nm. The light emitted from the light source LS travels through an illumination optical system IL to illuminate a mask (reticle) M on which a pattern to be transferred is formed. In the case of the exposure apparatus of the step-and-repeat method, the illumination optical system IL illuminates an entire area of a rectangular pattern region on the mask M. In the case of the exposure apparatus of the step-and-scan method, the illumination optical system IL illuminates a long and thin rectangular region along the X-direction perpendicular to the Y-direction which is a scanning direction, in a rectangular pattern region.

Figure 15:
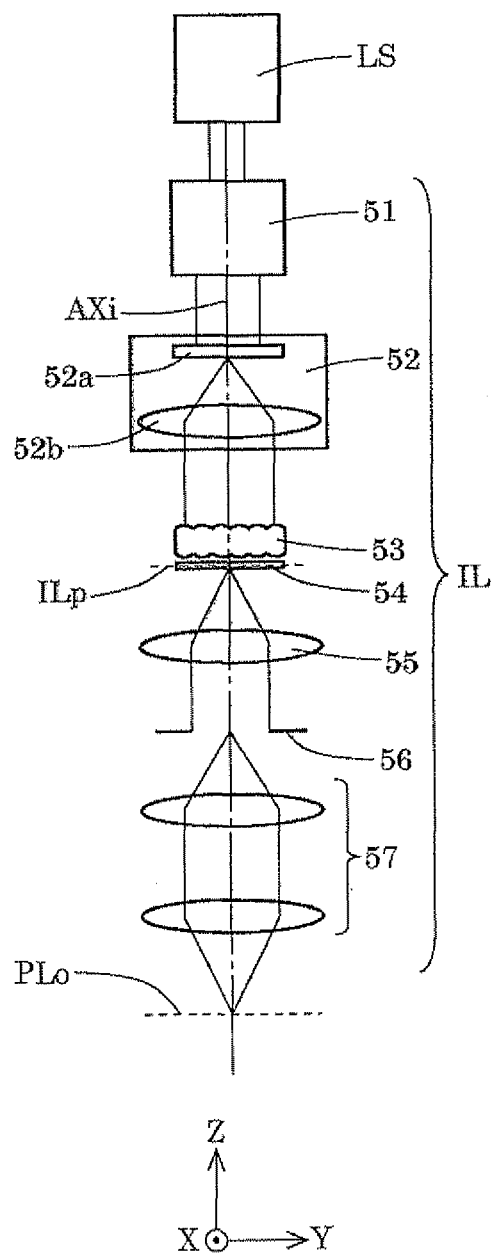
FIG. 15 is an exemplary drawing schematically showing an internal configuration of an illumination optical system shown in FIG. 14.

The beam emitted from the light source LS is incident, as shown in FIG. 15, into a beam sending system 51 having a well-known configuration. The beam entering the beam sending system 51 is shaped into a beam having a predetermined rectangular cross section, and then the shaped beam travels through a beam shape varying unit 52 to enter a micro fly's eye lens (or fly's eye lens) 53. The beam sending system 51 functions to guide the incident beam to the beam shape varying unit 52 while converting it into a beam having a cross section of appropriate size and shape, and to actively correct positional variation and angular variation of the beam incident to the beam shape varying unit 52 (and, in turn, to the micro fly's eye lens 53).

The beam shape varying unit 52 includes, for example, a spatial light modulator 52a and a relay optical system 52b and functions to vary the size and shape of an illumination field formed on an entrance plane of the micro fly's eye lens 53 and therefore to vary the size and shape of a substantial surface illuminant formed on a rear focal plane of the micro fly's eye lens 53. The spatial light modulator 52a applicable herein is, for example, a plurality of diffractive optical elements arranged so as to be switchable with respect to the illumination optical path in accordance with a control signal from a controller CR. A diffractive optical element is an optical element that converts a cross-sectional shape of an incident beam into another cross-sectional shape. In general, a diffractive optical element is constructed by forming steps at a pitch as long as the wavelength of exposure light (illumination light) in a substrate, and has an action to diffract an incident beam at desired angles.

The controller CR may be a processing unit (computer) having a recording medium such as a memory MR, and this memory MR stores a program for letting the processing unit execute the measuring method, and controlling methods of the exposure apparatus and the spatial modulator 52a according to the present embodiment.

The spatial light modulator 52a also applicable herein is, for example, a mirror array stationarily mounted with respect to the illumination optical path. The mirror array, as described above, is a spatial light modulator with a plurality of mirror elements individually controllable as arrayed in a predetermined plane. In the mirror array, the plurality of mirror elements are set in their respective predetermined orientations in accordance with a control signal from the controller CR and beams reflected at predetermined angles by the respective mirror elements form an illumination field of desired size and shape on the entrance plane of the micro fly's eye lens 53. The spatial light modulator 52a may also be a combination of a diffractive optical element and a mirror array.

The micro fly's eye lens 53 is, for example, an optical element consisting of a large number of microscopic lenses with a positive refractive power arrayed vertically and horizontally and densely, and is constructed by forming the microscopic lens group by etching on a plane-parallel plate. In the micro fly's eye lens, different from the fly's eye lens consisting of mutually isolated lens elements, the large number of microscopic lenses (microscopic refracting faces) are formed integrally without being isolated from each other. In terms of the configuration wherein the lens elements are arranged vertically and horizontally, however, the micro fly's eye lens is an optical integrator of the same wavefront division type as the fly's eye lens.

The rectangular microscopic refracting faces as unit wavefront division surfaces in the micro fly's eye lens 53 are of a rectangular shape similar to the shape of an illumination field to be formed on the mask M (and, therefore, the shape of an exposure region to be formed on the wafer W). The micro fly's eye lens 53 also applicable herein is, for example, a cylindrical micro fly's eye lens. The configuration and action of the cylindrical micro fly's eye lens are disclosed, for example, in U.S. Pat. No. 6,913,373.

The beam entering the micro fly's eye lens 53 is two-dimensionally divided by the large number of microscopic lenses to form a secondary light source (substantial surface illuminant consisting of a large number of small light sources: pupil intensity distribution) having a light intensity distribution approximately identical to a light intensity distribution formed on the entrance plane, on an illumination pupil ILp at or near its rear focal plane. Beams from the secondary light source formed on the illumination pupil ILp immediately after the micro fly's eye lens 53 are incident to an illumination aperture stop 54. The illumination aperture stop 54 is arranged on or near the rear focal plane of the micro fly's eye lens 53 and has an aperture (light transmitting portion) of a shape corresponding to the secondary light source.

The illumination aperture stop 54 is configured so as to be switchable with a plurality of aperture stops which are arranged to be inserted into or retracted from the illumination optical path and which have respective apertures of different sizes and shapes. A switching method of the illumination aperture stop 54 applicable herein is, for example, a well-known turret method or slide method. The illumination aperture stop 54 is arranged at a position optically conjugate with a pupil PLp of a below-described projection optical system PL and defines a range of contribution to illumination by the secondary light source. It is also possible to omit installation of the illumination aperture stop 54.

The beams from the secondary light source as limited by the illumination aperture stop 54 travel through a condenser optical system 55 to illuminate a mask blind 56 in a superimposed manner. In this way, a rectangular illumination field according to the shape and focal length of the rectangular microscopic refracting faces of the micro fly's eye lens 53 is formed on the mask blind 56 as an illumination field stop. Beams through a rectangular aperture (light transmitting portion) of the mask blind 56 are subjected to the condensing action of an illumination imaging optical system 57 and thereafter illuminate a mask M with a predetermined pattern thereon, in a superimposed manner. Namely, the illumination imaging optical system 57 forms an image of the rectangular aperture of the mask blind 56 on the mask M.

Light passing through a pattern surface of the mask M travels through the projection optical system PL, for example, having a demagnification ratio, to form a pattern image of the mask M in a unit exposure region on the wafer (photosensitive substrate) W coated with a photoresist. Namely, the mask pattern image is formed in a rectangular region similar to the entire pattern region of the mask M or in a long and thin rectangular region (still exposure region) in the X-direction, in the unit exposure region on the wafer W, so as to optically correspond to the illumination region on the mask M.

The mask M is held in parallel with the XY plane on a mask stage MS so that its pattern surface coincides with an object plane PLo of the projection optical system PL. The mask stage MS is equipped with a mechanism for moving the mask M in the X-direction, Y-direction, Z-direction, and directions of rotation around the Z-axis. The mask stage MS is provided with a moving mirror not shown, and a mask laser interferometer MIF using this moving mirror measures the X-directional position, Y-directional position, and rotational position around the Z-axis of the mask stage MS (and, therefore, the mask M) in real time.

The wafer W is held in parallel with the XY plane on a substrate stage WS so that its front surface (transfer surface) coincides with an image plane PLi of the projection optical system PL. The substrate stage WS is equipped with a mechanism for moving the wafer W in the X-direction, Y-direction, Z-direction, and directions of rotation around the Z-axis. The substrate stage WS is provided with a moving mirror not shown, and a substrate laser interferometer WIF using this moving mirror measures the X-directional position, Y-directional position, and rotational position around the Z-axis of the substrate stage WS (and, therefore, the wafer W) in real time.

The output from the mask laser interferometer MIF and the output from the substrate laser interferometer WIF are supplied to the controller CR. The controller CR controls the X-directional position, Y-directional position, and rotational position around the Z-axis of the mask M, based on the measurement result of the mask laser interferometer MIF. Namely, the controller CR transmits a control signal to the mechanism incorporated in the mask stage MS and this mechanism moves the mask stage MS on the basis of the control signal to adjust the X-directional position, Y-directional position, and rotational position around the Z-axis of the mask M.

The controller CR controls the Z-directional position (focus position) of the wafer W by the autofocus method in order to make the surface of the wafer W coincident with the image plane PLi of the projection optical system PL. The controller CR also controls the X-directional position, Y-directional position, and rotational position around the Z-axis of the wafer W, based on the measurement result of the substrate laser interferometer WIF. Namely, the controller CR transmits a control signal to the mechanism incorporated in the substrate stage WS, and this mechanism moves the substrate stage WS on the basis of the control signal to adjust the X-directional position, Y-directional position, and rotational position around the Z-axis of the wafer W.

In the step-and-repeat method, the pattern image of the mask M is collectively exposed in one unit exposure region out of a plurality of unit exposure regions set vertically and horizontally on the wafer W. Thereafter, the controller CR achieves step movement of the substrate stage WS along the XY plane to position another unit exposure region on the wafer W relative to the projection optical system PL. In this manner, the exposure apparatus repeatedly performs the full-shot exposure operation to collectively transfer the pattern image of the mask M to a unit exposure region on the wafer W.

In the step-and-scan method, the controller CR achieves scanning exposure to transfer the pattern image of the mask M to a unit exposure region on the wafer W with Y-directional movement of the mask stage MS and the substrate stage WS at a speed ratio according to the projection magnification of the projection optical system PL. Thereafter, the controller CR achieves step movement of the substrate stage WS along the XY plane to position another unit exposure region on the wafer W relative to the projection optical system PL. In this manner, the exposure apparatus repeatedly performs the scanning exposure operation to transfer the pattern image of the mask M to a unit exposure region on the wafer W.

Namely, in the step-and-scan method, the scanning exposure of the mask pattern is implemented in a region having the width equal to the long sides of the still exposure region and the length according to a scan amount (moving distance) of the wafer W, on the wafer W by synchronously moving (or scanning) the mask stage MS and the substrate stage WS and, therefore, the mask M and the wafer W along the Y-direction being the short-side direction of the rectangular still exposure region while performing the position controls of the mask M and the wafer W. It is assumed hereinafter that the projection optical system PL as an optical system to be examined, and the illumination optical system IL are coaxially arranged so that their axes AXp and AXi extend along a straight line extending in the Z-direction.

In the second embodiment, the mask M arranged on the illumination target surface of the illumination optical system IL is illuminated by Köhler illumination, using the secondary light source formed by the micro fly's eye lens 53, as a light source. For this reason, the position where the secondary light source is formed is optically conjugate with the position of an aperture stop AS of the projection optical system PL (and, therefore, with the position of the pupil PLp of the projection optical system PL), and thus the plane where the secondary light source is formed can be called an illumination pupil plane of the illumination optical system IL. Typically, the illumination target surface (the plane where the mask M is arranged or the plane where the wafer W is arranged if the illumination optical system is considered to include the projection optical system PL) is an optical Fourier transform plane for the illumination pupil plane.

The pupil intensity distribution is a light intensity distribution (luminance distribution) on the illumination pupil plane of the illumination optical system IL or on a plane optically conjugate with the illumination pupil plane. If the number of divisions of the wavefront by the micro fly's eye lens 53 is relatively large, a global light intensity distribution formed on the entrance plane of the micro fly's eye lens 53 exhibits a high correlation with a global light intensity distribution (pupil intensity distribution; pupil luminance distribution) of the entire secondary light source. For this reason, light intensity distributions on the entrance plane of the micro fly's eye lens 53 and on a plane optically conjugate with the entrance plane can also be called pupil intensity distributions.

The exposure apparatus of the second embodiment is provided with a measuring apparatus 13 for measuring the wavefront aberration of the projection optical system PL. The measuring apparatus 13 has the same configuration as the measuring apparatus 13 in the first embodiment and is attached to the substrate stage WS so that the x-, y-, and z-coordinates in FIG. 1 correspond to the X-, Y-, and Z-coordinates, respectively, in FIG. 14. The measuring apparatus 10' of the second embodiment (cf. FIG. 16) measures the pupil transmittance distribution of the projection optical system PL on an as-needed basis in a state in which it is mounted on the exposure apparatus, in order to improve the contrast of the pattern image formed through the projection optical system PL.

Figure 16:
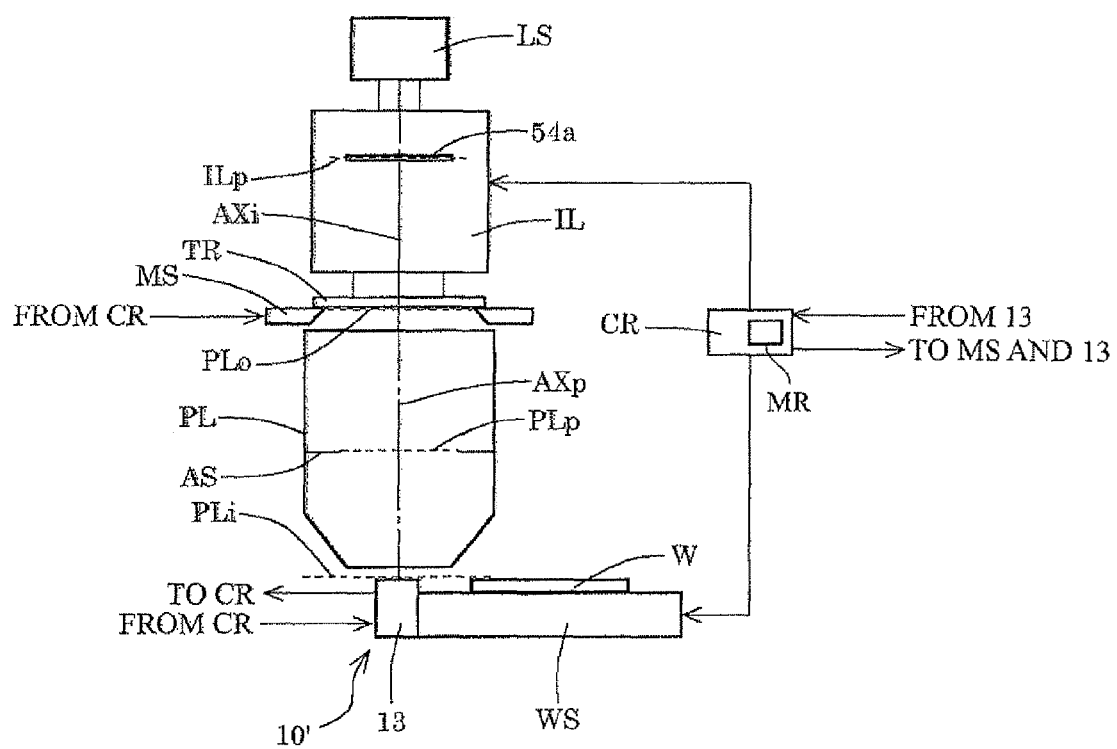
FIG. 16 is an exemplary drawing showing a measurement state of a pupil transmittance distribution of a projection optical system in the second embodiment.

In measurement of the pupil transmittance distribution of the projection optical system PL, as shown in FIG. 16, a measurement aperture stop 54a is mounted instead of the illumination aperture stop 54 in the illumination optical system IL (if the installation of the illumination aperture stop 54 is omitted, the measurement aperture stop 54a is set at the position thereof), and a measurement reticle TR is mounted instead of the mask M. Furthermore, the substrate stage WS is moved in accordance with a command from the controller CR to position the measuring apparatus 13 so that the entrance plane 13i of the planoconvex lens 13aa coincides with the image plane PLi of the projection optical system PL and so that the measurement aperture 13f is arranged at a predetermined position on the image plane PLi (position where the measurement light through the projection optical system PL is incident to the image plane PLi). The measuring apparatus 10' is provided with the illumination optical system IL including the measurement aperture stop 54a installed at the illumination pupil ILp, the measurement reticle TR, and the measuring unit 13.

Figure 17:
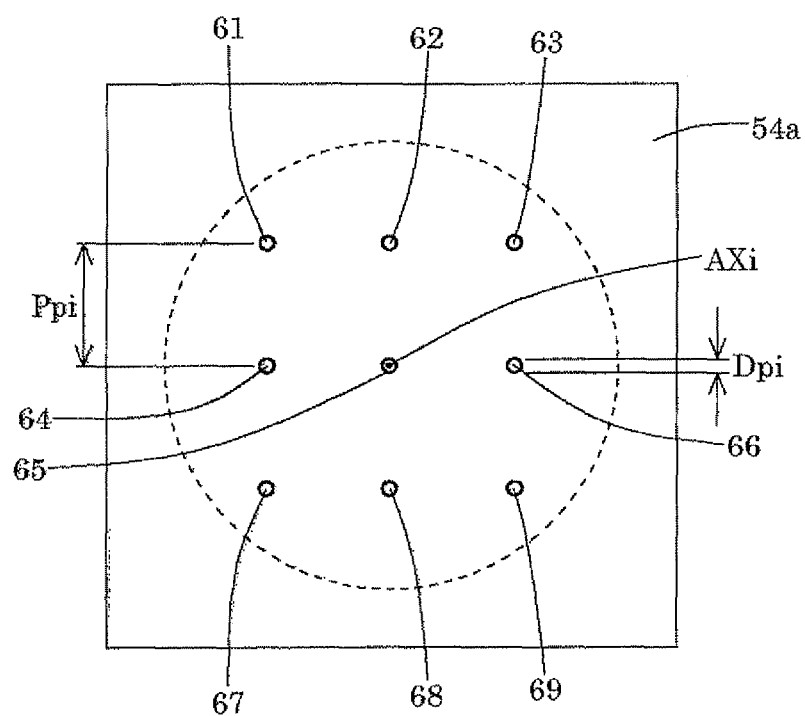
FIG. 17 is an exemplary drawing showing a state in which a measurement aperture stop is arranged at a position of an illumination pupil.

The measurement aperture stop 54a, as a relatively simple example, has nine apertures 61, 62, 63, 64, 65, 66, 67, 68, and 69 as shown in FIG. 17. For simplicity of description, it is assumed below that each of the apertures 61-69 is circular and that they have the same size. The apertures 61-64, 66-69 are assumed to be arrayed so that a center point of each aperture is coincident with a corner of a square with a center at the center aperture 65 or coincident with a midpoint of each side thereof. The measurement aperture stop 54a is assumed to be arranged so that the center point of the aperture 65 coincides with the axis AXi of the illumination optical system IL.

Specifically, the pitch Ppi of the apertures 61-69 can be set to approximately ten times the diameter Dpi of the apertures 61-69. If the diameter Dp of the apertures 61-69 is too large, pupil partial regions where the ±first-order diffracted beams generated through the respective apertures 61-69 and the phase grating of the measurement reticle TR pass through the pupil PLp of the projection optical system PL (i.e., diffraction spot images formed on the pupil PLp) will overlap in part with each other. The pitch Ppi of the apertures 61-69 is optional as to its absolute value, but it can be restricted so as to satisfy a predetermined relative relation with the pitch Pr of the phase grating of the measurement reticle TR as described below. However, if the pitch Ppi of the apertures 61-69 is too large, the partial overlap between the pupil partial regions can be readily avoided, but the transverse resolution of the pupil transmittance distribution information will be sacrificed in the case where the pupil transmittance distribution of the projection optical system PL is collectively measured without step movement of the measurement aperture stop 54a along the XY plane.

Figure 18:
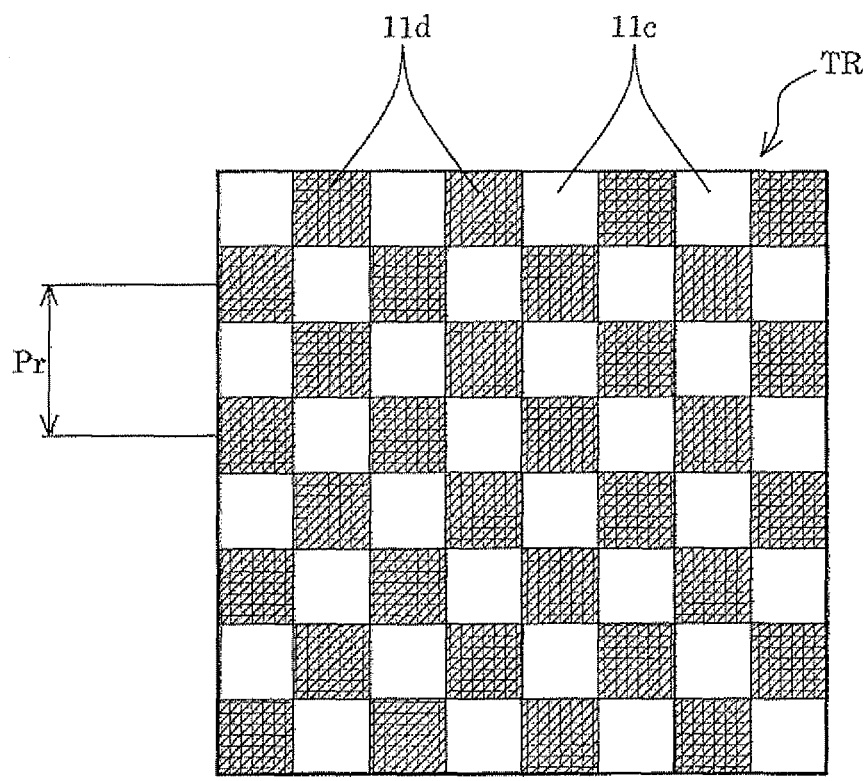
FIG. 18 is an exemplary drawing schematically showing a phase grating formed on a measurement reticle shown in FIG. 14.
Figure 18:
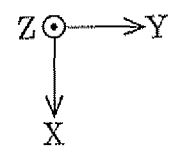

On the surface of the measurement reticle TR, as shown in FIG. 18, a phase grating (phase pattern) is formed in which rectangular first phase regions 11c to impart a first phase value to transmitted light and rectangular second phase regions 11d to impart a second phase value different by π from the first phase value to transmitted light are alternately arranged along two directions orthogonal to each other. In other words, the phase grating of the measurement reticle TR has a form in which the two types of rectangular phase regions 11c, 11d are arranged so as to form a check flag pattern (i.e., a form in which the two types of rectangular phase regions 11c, 11d are arranged in a checkered pattern).

It is assumed in the description hereinafter that each of the phase regions 11c, 11d is square and that they have the same size. The measurement reticle TR is assumed to be mounted so that the pitch directions of the phase regions 11c, 11d coincide with the X-direction and Y-direction and so that the diffractive optical surface coincides with the object plane PLo of the projection optical system PL. The pitch Pr of the phase regions 11c, 11d can be restricted so as to satisfy a predetermined relative relation with the pitch Ppi of the apertures 61-69 provided in the aperture stop 54a, as described below.

On the aperture stop 54a, a light beam is incident to a required region including the apertures 61-69 (e.g., a circular region including the apertures 61-69). In this case, a beam through the center aperture 65 is emitted from the illumination optical system IL, and is incident normally (or incident in parallel with the optical axis AXp of the projection optical system PL) to a predetermined position on the phase grating of the measurement reticle TR (and therefore to a predetermined position on the object plane PLo of the projection optical system PL). Beams through the apertures 61-64, 66-69 other than the aperture 65, i.e., circular localized beams with a light intensity distribution localized at the positions apart from the optical axis AXi on the illumination pupil ILp optically conjugate with the pupil PLp of the projection optical system PL are emitted from the illumination optical system IL and are incident as eight beams inclined relative to the optical axis AXp (and, therefore, relative to the optical axis AXi), to the predetermined position on the phase grating of the measurement reticle TR.

The incidence position of the nine beams to the measurement reticle TR is variably determined, for example, by the action of the mask blind 56. Alternatively, it is variably determined by a field stop (not shown) arranged near the mask blind 56, or a field stop (not shown) arranged at a position immediately in front of the object plane PLo, or the like. In this manner, the nine beams from the apertures 61-69 are simultaneously incident to the same position on the phase grating of the measurement reticle TR. It is assumed below for simplicity of description that the illumination pupil ILp of the illumination optical system IL and the pupil PLp of the projection optical system PL are in a conjugate relation to form an erect image of the illumination pupil ILp with respect to the X-direction and Y-direction on the pupil PLp.

Figure 19:
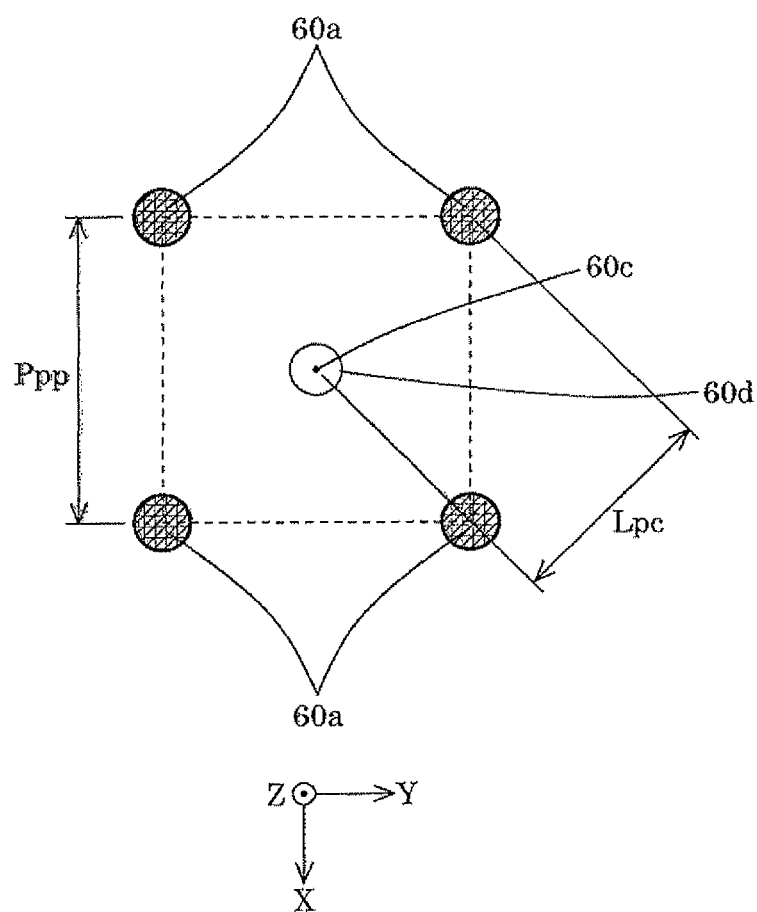
FIG. 19 is an exemplary drawing showing four pupil partial regions where ±first-order diffracted beams generated through a measurement reticle from one aperture of a measurement aperture stop pass through a pupil of the projection optical system.

When attention is focused on one beam incident to the measurement reticle TR, a pair of +first-order diffracted beams and a pair of −first-order diffracted beams as measurement targets out of diffracted beams generated through the phase grating of the measurement reticle TR pass through four pupil partial regions 60a in an effective region of the pupil PLp of the projection optical system PL, as shown in FIG. 19, and are emitted each from the projection optical system PL. The four pupil partial regions 60a are circular as the apertures 61-69 are, and have the same size. Respective centers of the four pupil partial regions 60a are located at corner positions of a square defined by four sides extending in the X-direction and Y-direction with a point 60c as a center.

The point 60c is a center of a region 60d where the zero-order light would pass through the pupil PLp if the zero-order light should be generated through the phase grating of the measurement reticle TR. Namely, the center position 60c of the four pupil partial regions 60a is dependent upon the positions of the associated apertures in the aperture stop 54a. The size of the pupil partial regions 60a is significantly dependent upon the size of each aperture 61-69 in the aperture stop 54a. The pitch Ppp of the pupil partial regions 60a is dependent upon the pitch Pr of the phase regions 11c, 11d in the phase grating of the measurement reticle TR.

Specifically, the pitch Ppp of the pupil partial regions 60a is represented by Eq (1) below, where λ represents the wavelength of the light and NAo the numerical aperture on the entrance side (object side) of the projection optical system PL. The distance Lpc between the center of each pupil partial region 60a and the point 60c is represented by Eq (2) below. In Eq (1) and Eq (2), the pitch Pr is normalized by the numerical aperture NAo of the beam incident to the projection optical system PL.

$$Ppp = (2 \times \lambda / Pr) / NAo \quad (1)$$

$$Lpc = (\sqrt{2} \times \lambda / Pr) / NAo \quad (2)$$

Figure 20:
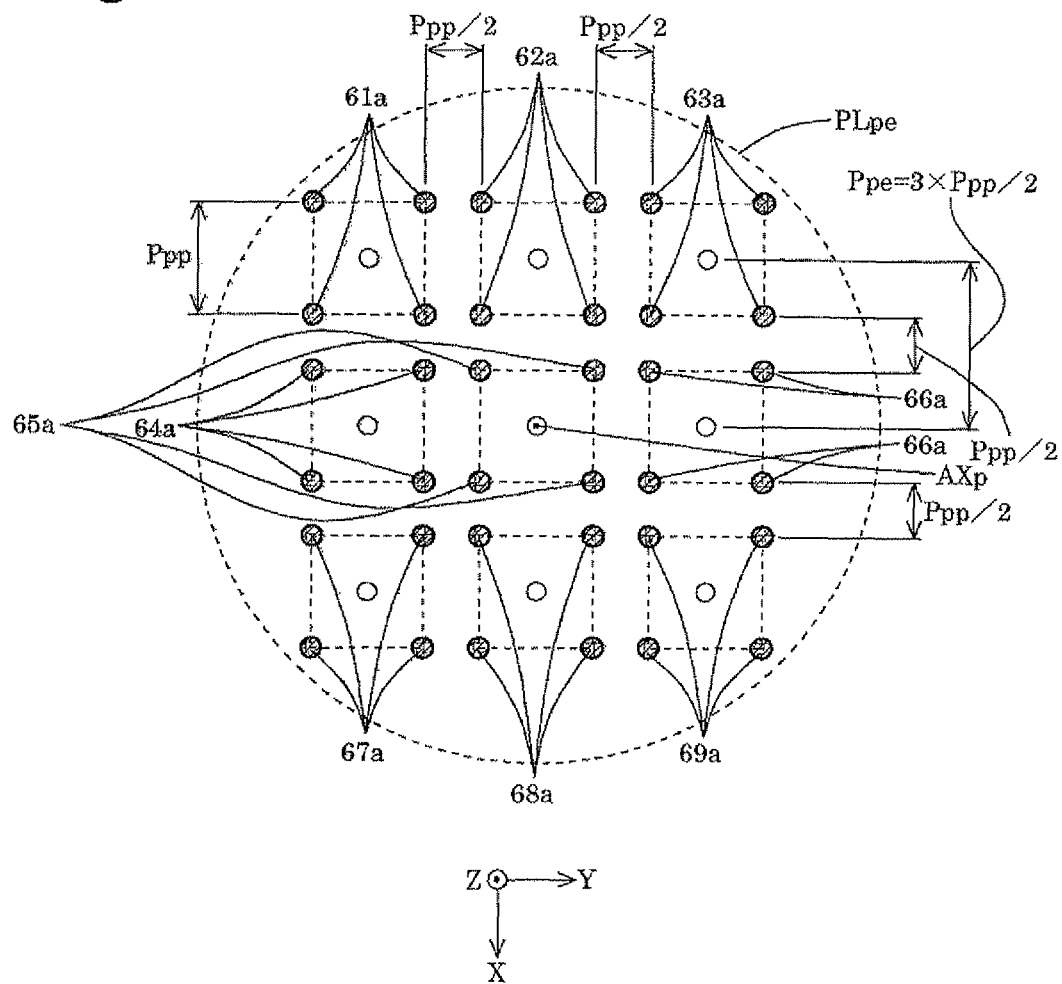
FIG. 20 is an exemplary drawing showing thirty six pupil partial regions where ±first-order diffracted beams generated through a measurement reticle from nine apertures of a measurement aperture stop pass through the pupil of the projection optical system.

The ±first-order diffracted beams generated through the nine apertures 61-69 of the aperture stop 54a and the phase grating of the measurement reticle TR pass through thirty six (=4×9) pupil partial regions 61a-69a in the effective region PLpe of the pupil PLp of the projection optical system PL, as shown in FIG. 20, and they are emitted each from the projection optical system PL. An array pattern of the thirty six pupil partial regions 61a-69a is obtained by convolution between the array pattern of the nine apertures 61-69 of the aperture stop 54a shown in FIG. 17 and the array pattern of the four pupil partial regions 60a where the ±first-order diffracted beams generated from one beam pass through the pupil PLp of the projection optical system PL as shown in FIG. 19.

As described below, in order to avoid overlapping of the ±third-order diffracted beams excluded from the measurement with the ±first-order diffracted beams of measurement targets on the pupil PLp of the projection optical system PL, the thirty six pupil partial regions 61a-69a are assumed to be arrayed so that the X-directional space and Y-directional space between the four pupil partial regions corresponding to one beam and the four pupil partial regions adjacent thereto corresponding to another beam in FIG. 20 become equal to half of the pitch Ppp of the four pupil partial regions (i.e., Ppp/2). In this case, the distance between the center of the four pupil partial regions and the center of the four pupil partial regions adjacent thereto (i.e., the distance optically corresponding to the pitch Ppi of the apertures) is the value of 3/2 times the pitch Ppp of the four pupil partial regions.

The ±first-order diffracted beams through the thirty six pupil partial regions 61a-69a and the projection optical system PL travel through the measurement aperture 13f of the measuring unit 13 to enter the objective optical system 13a. The ±first-order diffracted beams through the objective optical system 13a are detected by the photoelectric detector 13b on the detection surface 13ba arranged on the pupil plane 13p. As a consequence, thirty six circular light incident regions (not shown) discretely distributed in the same manner as the array pattern of the thirty six pupil partial regions 61a-69a on the pupil PLp of the projection optical system PL, are also formed on the detection surface 13ba.

It is assumed below for simplicity of description that the intensities of the thirty six ±first-order diffracted beams generated through the phase grating of the measurement reticle TR are identical to each other and that a ratio of respective intensities of the thirty six ±first-order diffracted beams at the image plane PLi of the projection optical system PL is coincident with a ratio of respective intensities of the thirty six ±first-order diffracted beams detected on the detection surface 13ba of the measuring unit 13. In other words, the measuring unit 13 is assumed to be able to accurately measure the mutual intensity ratio of the thirty six ±first-order diffracted beams at the image plane PLi of the projection optical system PL, without being affected by the pupil transmittance distribution of the objective optical system 13a or the like.

In this case, the measuring apparatus 10' simultaneously supplies the nine beams as many as the apertures 61-69 to the predetermined position on the phase grating of the measurement reticle TR, using the aperture stop 54a with the nine apertures 61-69 arrayed according to the required distribution, and measures the intensities of the totally thirty six ±first-order diffracted beams generated from the respective beams, by the measuring unit 13. The measuring apparatus 10' determines the relative ratio of pupil transmittances in the thirty six pupil partial regions 61a-69a distributed across the entire pupil effective region PLpe of the projection optical system PL, based on the measured values, and collectively measures the pupil transmittance distribution of the projection optical system PL about the thirty six pupil partial regions 61a-69a eventually.

As a consequence, we can obtain the relative information of pupil transmittances among the thirty six pupil partial regions distributed across the entire pupil effective region PL20pe of the projection optical system PL, and directly obtain the two-dimensional pupil transmittance distribution of the projection optical system PL as a functional distribution, for example, by the Zernike fitting process for the distribution of relative values of these discrete pupil transmittances. As described above, the measuring apparatus 10' of the second embodiment does not need to perform the step movement of the aperture stop 54a and requires only one measurement by the measuring unit 13, and therefore it is able to accurately and quickly measure the pupil transmittance distribution of the projection optical system PL on an as-needed basis in the state in which it is mounted on the exposure apparatus.

As described above, since the measuring apparatus 10' of the second embodiment uses the measurement reticle TR with the phase grating in which the two types of phase regions 11c, 11d are arranged so as to form the check flag pattern, the intensities of the ±first-order diffracted light components as measurement targets out of the diffracted beams generated through the phase grating of the measurement reticle TR are identical to each other. As a result, the photoelectric detector 13b of the measuring unit 13 is able to accurately detect each of the diffracted light components, using a relatively narrow dynamic range, and therefore to accurately measure the pupil transmittance distribution of the projection optical system PL. Since the measuring apparatus uses the measurement reticle TR with the phase grating in which the two types of phase regions 11c and 11d with the phase difference of π are alternately arranged, the zero-order light to be excluded from the measurement is prevented from being generated and affecting the measurement of intensities of ±first-order diffracted light components, and therefore the measuring apparatus is able to accurately detect each of the components.

Furthermore, there is no need for changing the posture of the measurement reticle TR or for replacing it with another measurement reticle having a different property, and the measuring apparatus is able to collectively measure the pupil transmittance distribution of the projection optical system PL or to quickly measure it with a very low load, by simply mounting the aperture stop 54a with the plurality of apertures 61-69 stationarily in the illumination optical path. In other words, the measuring apparatus is able to quickly measure the pupil transmittance distribution of the projection optical system PL with a very low load, based on the single measurement result by the measuring unit 13, in the state in which the measurement reticle TR and the aperture stop 54a are stationarily set.

In the measuring apparatus 10' of the second embodiment, it is important that the thirty six pupil partial regions 61a-69a be separated from each other in order to accurately measure the intensities of the respective diffracted light components and that the size of the pupil partial regions 61a-69a (and, therefore, the size of the apertures 61-69) be controlled at some small level in order to accurately measure the pupil transmittance distribution. Namely, the center-center distance between the pupil partial regions 61a-69a optically corresponding to the apertures 61-69 of the aperture stop 54a does not have to be set excessively large, and therefore the pitch Pr of the phase regions 11c and 11d in the phase grating of the measurement reticle TR does not have to be set excessively small, which eventually facilitates manufacture of the measurement reticle TR.

In the exposure apparatus of the second embodiment, the controller CR changes the illumination condition for illuminating the pattern on the mask M, based on the measurement result of the pupil transmittance distribution of the projection optical system PL measured by the measuring apparatus 10' (or by the measuring method with the measuring apparatus 10'), to perform desired exposure. Specifically, the controller CR refers to the measurement result of the pupil transmittance distribution and supplies such a control signal as to improve the contrast of the pattern image formed through the projection optical system PL, for example, to the beam shape varying unit 52 including the spatial light modulator 52a, to change the illuminance distribution in the illumination region formed on the pattern surface of the mask M and/or the pupil luminance distribution on the illumination pupil ILp by the action of the spatial light modulator 52a and others.

Furthermore, the exposure apparatus of the second embodiment is also able to improve the contrast of the pattern image formed through the projection optical system PL, using the mask M with a pattern created based on the measurement result of the pupil transmittance distribution of the projection optical system PL measured by the measuring apparatus 10', instead of the change of the illuminance distribution and/or the pupil luminance distribution, or in addition to the change of the illuminance distribution and/or the pupil luminance distribution. The exposure apparatus of the second embodiment may also be configured so as to let the controller CR as an information processing unit execute the measuring method with the measuring apparatus 10', for example, in accordance with a predetermined program.

In the measuring apparatus 10' of the second embodiment, the ±third-order diffracted beams, ±fifth-order diffracted beams, etc. are also generated through the phase grating of the measurement reticle TR as in the case of the measuring apparatus 10 in the first embodiment. In this case, the measuring apparatus may be arranged as follows: the ±third-order diffracted beams, ±fifth-order diffracted beams, etc. are excluded from the measurement, the ±fifth-order diffracted beams (and higher-order diffracted beams) with the intensity extremely smaller than that of the ±first-order diffracted beams of measurement targets are ignored, and the ±third-order diffracted beams are set so as not to overlap with the ±first-order diffracted beams on the pupil PLp of the projection optical system PL. A technique for setting the ±third-order diffracted beams so as not to overlap with the ±first-order diffracted beams in the pupil effective region PLpe of the projection optical system PL in the second embodiment will be described below.

Figure 21:
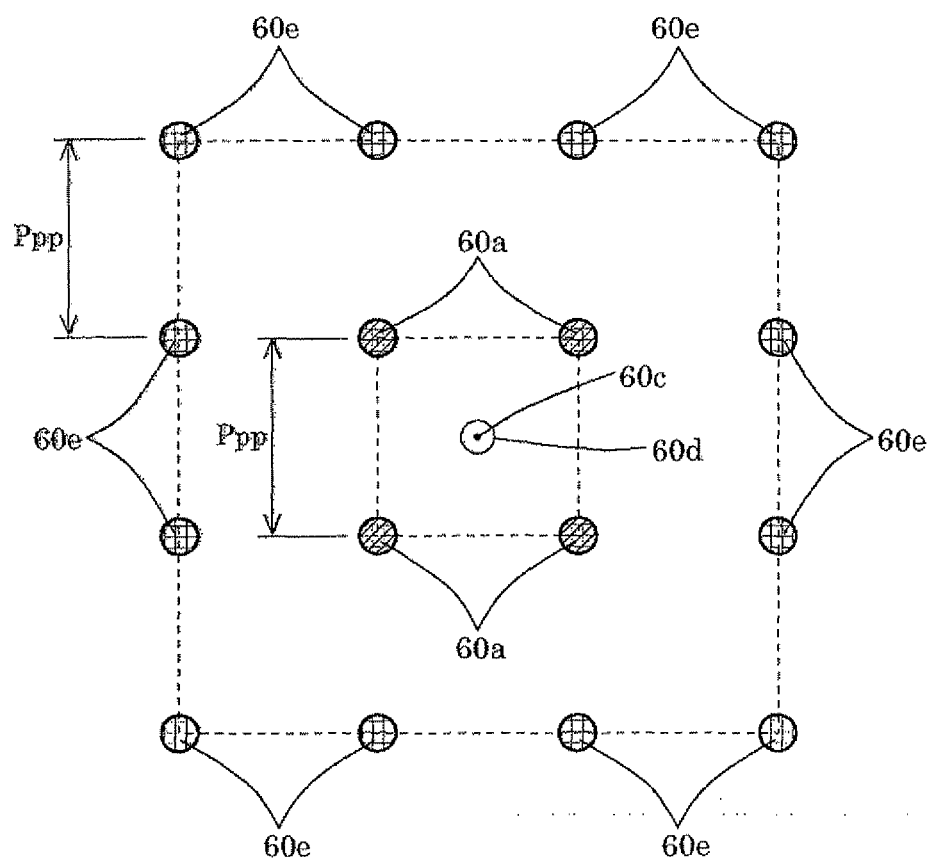
FIG. 21 is an exemplary drawing showing sixteen pupil partial regions where ±first-order diffracted beams and ±third-order diffracted beams generated through a measurement reticle from one aperture of a measurement aperture stop pass through the pupil of the projection optical system.

When attention is focused on one beam incident to the measurement reticle TR, the ±third-order diffracted beams to be excluded from the measurement, out of the diffracted beams generated through the phase grating of the measurement reticle TR pass through twelve pupil partial regions 60e on the pupil PLp of the projection optical system PL, as shown in FIG. 21, and are emitted each from the projection optical system PL. The twelve pupil partial regions 60e are circular as the four pupil partial regions 60a associated with the ±first-order diffracted beams are, and have the same size. Respective centers of the twelve pupil partial regions 60e are located at positions of corners of a square defined, by four sides extending in the X-direction and Y-direction with the point 60c as a center, and at positions of points where each side is trisected.

The center-center distance between two X-directionally or Y-directionally adjacent regions among the twelve pupil partial regions 60e is equal to the pitch Ppp being the center-center distance between two X-directionally or Y-directionally adjacent regions among the four pupil partial regions 60a. Each of the sides of the square obtained by connecting the respective centers of the twelve pupil partial regions 60e has a length equal to three times the side of the square formed by connecting the respective centers of the four pupil partial regions 60a (=3×Ppp).

Figure 22:
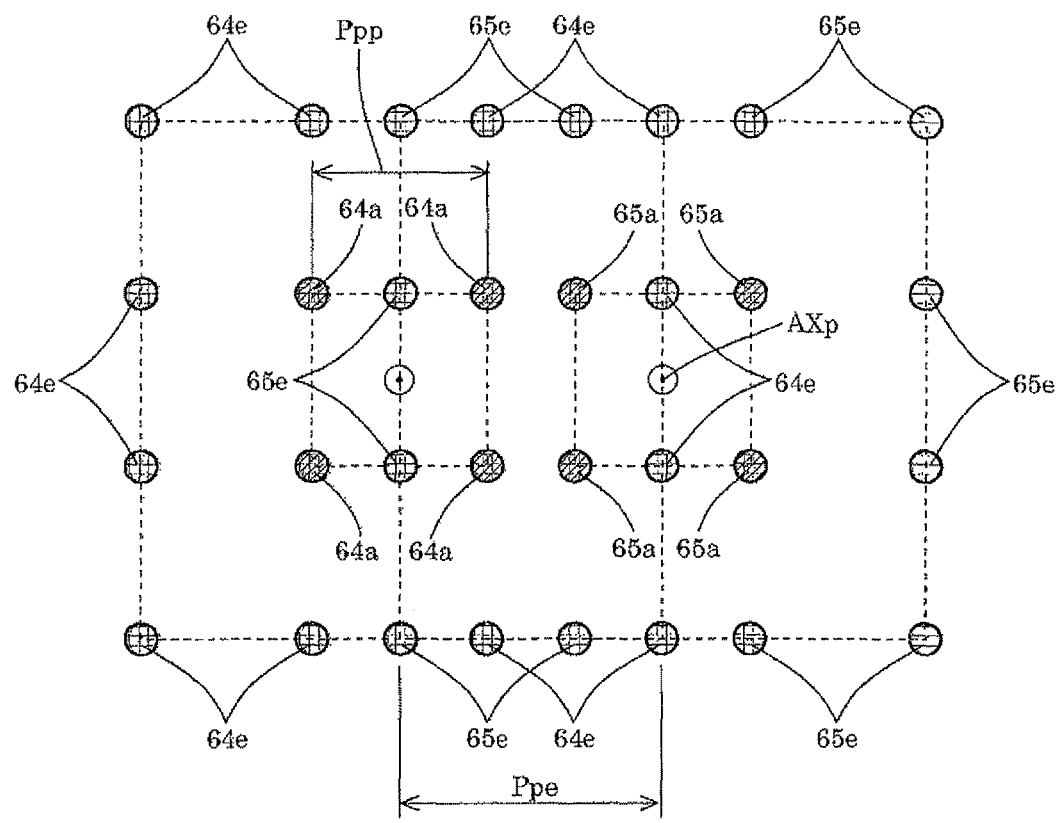
FIG. 22 is an exemplary drawing showing thirty two pupil partial regions where ±first-order diffracted beams and ±third-order diffracted beams generated through a measurement reticle from two adjacent apertures of a measurement aperture stop pass through the pupil of the projection optical system.

Therefore, the ±third-order diffracted beams generated through the two Y-directionally adjacent apertures 64, 65 in the aperture stop 54a and the phase grating of the measurement reticle TR pass through twenty four (=12×2) pupil partial regions 64e, 65e on the pupil PLp of the projection optical system PL, as shown in FIG. 22, and they are emitted each from the projection optical system PL. FIG. 22 is depicted without illustration of the pupil partial regions corresponding to the ±first-order diffracted beams and ±third-order diffracted beams generated through the other apertures 61-63, 66-69 and the phase grating of the measurement reticle TR, for clarity of the drawing.

With reference to FIG. 22, however, since the thirty six pupil partial regions 61a-69a corresponding to the ±first-order diffracted beams of measurement targets are set so as to exhibit the array pattern shown in FIG. 20, it is readily presumed that the ±third-order diffracted beams are most unlikely to overlap with the ±first-order diffracted beams on the pupil PLp of the projection optical system PL. Now, let us consider a condition to be satisfied when the thirty six pupil partial regions 61a-69a corresponding to the ±first-order diffracted beams exhibit the array pattern shown in FIG. 20, with reference to FIGS. 19 to 22.

The pitch Ppp of the pupil partial regions (60a; 61a-69a) corresponding to the ±first-order diffracted beams is represented by aforementioned Eq (1). The distance Ppe between the center of the four pupil partial regions (e.g., 64a) and the center of the four pupil partial regions adjacent thereto (e.g., 65a), i.e., the distance Ppe optically corresponding to the pitch Ppi of the apertures 61-69 on the pupil PLp of the projection optical system PL is equal to the value of 3/2 times the pitch Ppp (=3×(λ/Pr)/NAo). On the other hand, the distance Ppe is also represented by Eq (3) below, using the pitch Ppi of the apertures 61-69 and the radius Ra of the pupil effective region PLpe of the projection optical system PL.

$$Ppe = Ppi/Ra \quad (3)$$

Therefore, when the relation in Eq (4) below is satisfied, the thirty six pupil partial regions 61a-69a corresponding to the ±first-order diffracted beams of measurement targets exhibit the array pattern as shown in FIG. 20 and the ±third-order diffracted beams become most unlikely to overlap with the ±first-order diffracted beams on the pupil PLp of the projection optical system PL. In practice, when the measuring apparatus is set so as to satisfy the relation represented by Eq (4), it becomes able to perform high-accuracy measurement of the pupil transmittance distribution without being affected by the ±third-order diffracted beams.

$$Ppi/Ra = 3 \times (\lambda/Pr)/NAo \quad (4)$$

In the description about the above-described second embodiment, the beams as many as the apertures are simultaneously supplied to the predetermined position on the phase grating of the measurement reticle TR, using the aperture stop 54a with the plurality of apertures arranged according to the required distribution, and the pupil transmittance distribution of the projection optical system PL is collectively measured based on the ±first-order diffracted beams generated from the respective beams. However, without having to be limited to this, it is also possible to adopt a configuration wherein by action of a mirror array as the spatial light modulator 52a, the apertures of the aperture stop 54a each are successively illuminated to successively supply the beams through the respective apertures to the predetermined position on the phase grating of the measurement reticle TR and wherein the pupil transmittance distribution of the projection optical system PL is measured based on the ±first-order diffracted beams successively generated from the respective beams. Furthermore, it is also possible to adopt a technique of simultaneously or successively forming the localized beams corresponding to the respective apertures by action of the mirror array, without installation of the aperture stop 54a.

In the description about the above-described second embodiment, it is assumed that the measuring unit 13 can accurately measure the mutual intensity ratio of the f first-order diffracted beams, without being affected by the pupil transmittance distribution of the objective optical system 13a. However, if the influence of the pupil transmittance distribution of the objective optical system 13a is not negligibly small, the aforementioned technique described in association with the first embodiment may be applied to detect the error of the measurement result due to the pupil transmittance distribution of the objective optical system 13a of the measuring unit 13 and calibrate the measurement result of the pupil transmittance distribution of the projection optical system PL therewith. Furthermore, the measuring unit 13 can be replaced by the PDI/LDI type measuring unit 13A or by the measuring unit 13B making use of the shearing interferometer.

In the description about the above-described second embodiment, it is assumed that the pupil transmittance ratio in the four pupil partial regions corresponding to one beam and the pupil transmittance ratio in the four pupil partial regions corresponding to another beam are measured under the same condition. However, where this assumption does not hold, the ratio of the pupil transmittances in the pupil partial regions 64a and the pupil transmittances in the pupil partial regions 65a cannot be accurately determined, for example, even if the pupil transmittance ratio in the four pupil partial regions 64a and the pupil transmittance ratio in the other four pupil partial regions 65a can be accurately determined.

Figure 23:
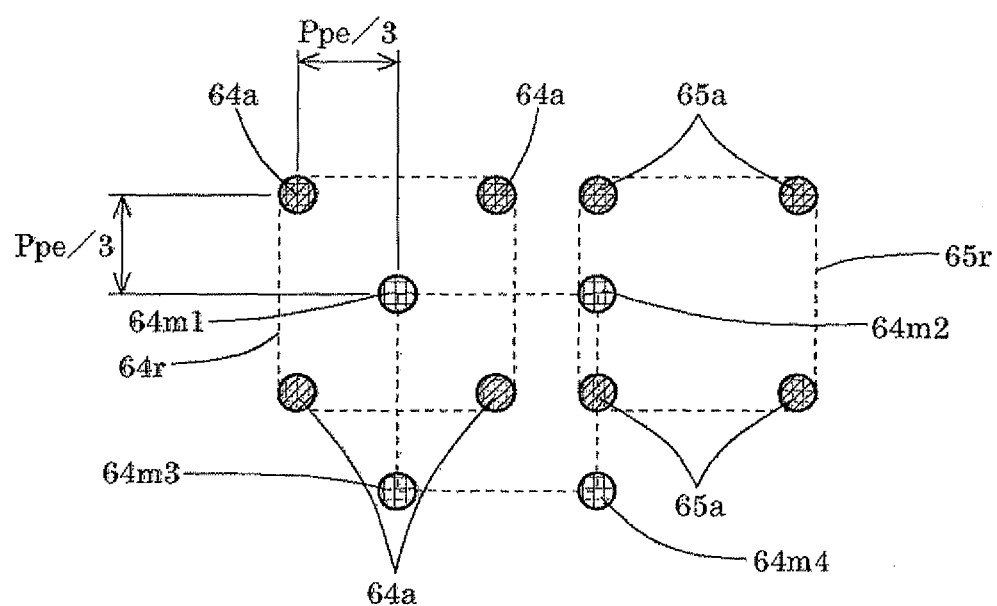
FIG. 23 is an exemplary drawing for explaining a technique for supplementing relative ratio information of pupil transmittance distribution of the projection optical system.

In this case, before or after the measurement carried out in the setting of the aperture stop 54a as shown in FIG. 17, the measurement is carried out, for example, in a state in which the aperture stop 54a is shifted by Ppi/3 in the +X-direction and by Ppi/3 in the +Y-direction. As a result, the ±first-order diffracted beams generated through the aperture 64 of the aperture stop 54a and the phase grating of the measurement reticle TR pass through four pupil partial regions 64m1, 64*m*2, 64*m*3, and 64*m*4 on the pupil PLp of the projection optical system PL, as shown in FIG. 23, and they are emitted each from the projection optical system PL. At this time, the four pupil partial regions 64*m*1-64*m*4 are located at positions with the shift of Ppe/3 in the +X-direction and the shift of Ppe/3 in the +Y-direction from the four pupil partial regions 64*a* on the pupil PLp of the projection optical system PL.

As a result, the pupil partial region 64*m*1 is in an inclusion region 64*r* including the four pupil partial regions 64*a* corresponding to one beam and the pupil partial region 64*m*2 is in an inclusion region 65*r* including the four pupil partial regions 65*a* corresponding to another beam. In this manner, we can obtain a ratio of the pupil transmittance in the pupil partial region 64*m*1 and the pupil transmittance in the pupil partial region 64*m*2, for example, and supplement the relative ratio information of the pupil transmittance distribution about the pupil partial regions 64*a* and 65*a* on the basis of the pupil transmittance ratio thus obtained. FIG. 23 is depicted without illustration of the pupil partial regions corresponding to the ±first-order diffracted beams generated through the other apertures 61-63, 65-69 of the aperture stop 54*a* and the phase grating of the measurement reticle TR, for clarity of the drawing. However, as seen with reference to FIG. 23, it is readily presumed that the relative ratio information of the pupil transmittance distribution can be supplemented about the pupil partial regions 61*a*-69*a*.

In the description about the above-described second embodiment, since the embodiment is applied to the exposure apparatus using the transmission type mask M, the transmission type measurement reticle TR is used in place of the transmission type mask M. However, for example, in the case of the exposure apparatus using a reflection type mask, a reflection type measurement reticle will be used in place of the reflection type mask. In the foregoing second embodiment, as in the case of the first embodiment, a variety of fauns can be contemplated as to the specific configuration of the phase grating of the measurement reticle, the specific configuration of the measuring unit, the number, shape, size, and position of the localized beams formed on the illumination pupil, and so on.

The foregoing second embodiment showed the projection optical system used in the exposure apparatus, as an optical system to be examined, but the optical system to be examined can be any optical system as long as it is an imaging optical system. If the optical system to be examined is a non-imaging optical system, e.g., a Fourier transform optical system, the measurement result of the pupil transmittance distribution of the non-imaging optical system can be obtained in such a manner that an imaging optical system is configured by combining the optical system to be examined, with a Fourier transform optical system having a known pupil transmittance distribution and that the pupil transmittance distribution of the optical system to be combined is subtracted from the measurement result of the pupil transmittance distribution of the imaging optical system.

In the aforementioned embodiment, the mask can be replaced with a variable pattern forming device which forms a predetermined pattern on the basis of predetermined electronic data. Use of such a variable pattern forming device can minimize influence on synchronization accuracy even if the pattern surface is set vertical. The variable pattern forming device applicable herein can be, for example, a DMD (Digital Micromirror Device) including a plurality of reflective elements driven based on predetermined electronic data. The exposure apparatus with the DMD is disclosed, for example, in Japanese Patent Application Laid-Open No. 2004-304135 and U.S. Patent Application Laid-Open No. 2007/0296936.

Besides the reflective spatial light modulators of the non-emission type like the DMD, it is also possible to apply a transmissive spatial light modulator or a self-emission type image display device. The teachings of U.S. patent application Laid-Open No. 2007/0296936 are incorporated herein by reference.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus may be performed in a clean room in which the temperature, cleanliness, etc. are controlled.

Figure 24:
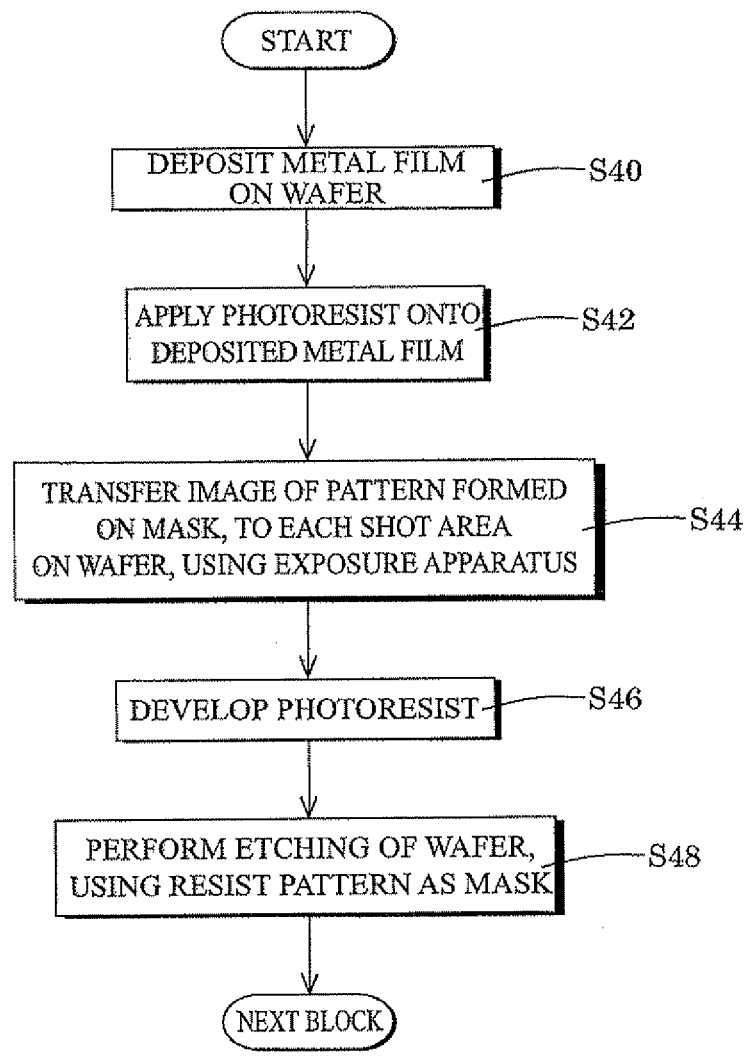
FIG. 24 is an exemplary flowchart showing blocks of manufacturing semiconductor devices.

The following will describe a device manufacturing method using the exposure apparatus according to the above-described embodiment. FIG. 24 is a flowchart showing manufacturing blocks of semiconductor devices. As shown in FIG. 24, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the projection exposure apparatus of the above embodiment (block S44: exposure block), and developing the wafer W after completion of the transfer, i.e., developing the photoresist on which the pattern has been transferred (block S46: development block).

Thereafter, using the resist pattern made on the surface of the wafer W in block S46, as a mask, processing such as etching is carried out on the surface of the wafer W (block S48: processing block). The resist pattern herein is a photoresist layer in which depressions and projections are formed in a shape corresponding to the pattern transferred by the projection exposure apparatus of the above embodiment and which the depressions penetrate throughout. Block S48 is to process the surface of the wafer W through this resist pattern. The processing carried out in block S48 includes, for example, at least either etching of the surface of the wafer W or deposition of a metal film or the like. In block S44, the projection exposure apparatus of the above embodiment performs the transfer of the pattern onto the wafer W coated with the photoresist, as a photosensitive substrate or plate P.

Figure 25:
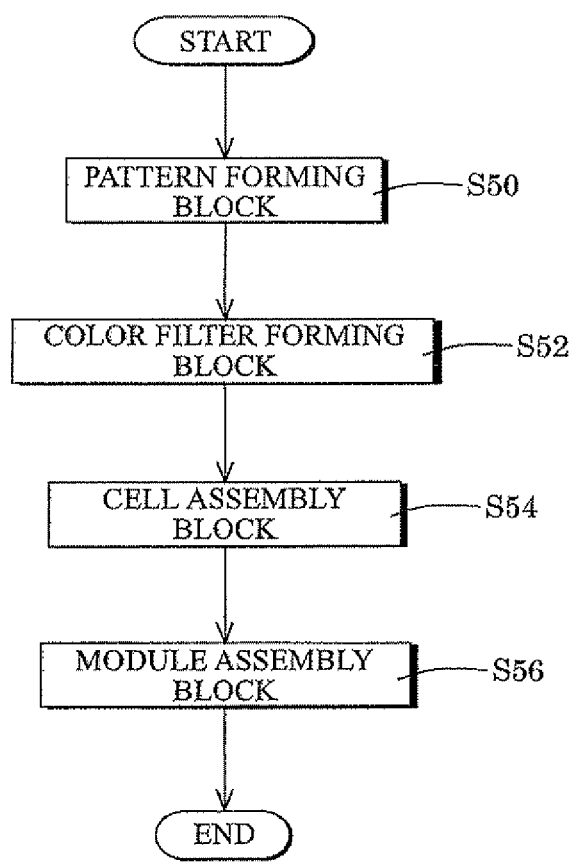
FIG. 25 is an exemplary flowchart showing blocks of manufacturing a liquid crystal device such as a liquid crystal display device.

FIG. 25 is a flowchart showing manufacturing blocks of a liquid crystal device such as a liquid crystal display device. As shown in FIG. 25, the manufacturing blocks of the liquid crystal device include sequentially performing a pattern forming block (block S50), a color filter forming block (block S52), a cell assembly block (block S54), and a module assembly block (block S56). The pattern forming block of block S50 is to form predetermined patterns such as a circuit pattern and an electrode pattern on a glass substrate coated with a photoresist, as a plate P, using the projection exposure apparatus of the above embodiment. This pattern forming block includes an exposure block of transferring a pattern to a photoresist layer, using the projection exposure apparatus of the above embodiment, a development block of performing development of the plate P on which the pattern has been transferred, i.e., development of the photoresist layer on the glass substrate, to make the photoresist layer in a shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction. The cell assembly block of block S54 is to assemble a liquid crystal panel (liquid crystal cell), using the glass substrate on which the predetermined pattern has been formed in block S50, and the color filter formed in block S52. Specifically, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

The embodiments of the present invention are not limited just to the application to the exposure apparatus for manufacture of semiconductor devices, but can also be widely applied, for example, to the exposure apparatus for display devices such as liquid crystal display devices or plasma displays formed with rectangular glass plates, and the exposure apparatus for manufacture of various devices such as imaging devices (CCDs and others), micro machines, thin-film magnetic heads, and DNA chips. Furthermore, the embodiments of the present invention are also applicable to the exposure block (exposure apparatus) for manufacture of masks (photomasks, reticles, etc.) on which mask patterns of various devices are formed, by the photolithography process.

The aforementioned embodiment used the ArF excimer laser light (the wavelength: 193 nm) or the KrF excimer laser light (the wavelength: 248 nm) as the exposure light, but the exposure light does not have to be limited to these: the present invention can also be embodied by applying any other appropriate laser light source, e.g., an $F_2$ laser light source for supplying the laser light at the wavelength of 157 nm, to the embodiments of the present invention.

In the foregoing embodiment, it is also possible to apply a technique of filling the space in the optical path between the projection optical system and the photosensitive substrate with a medium having the refractive index larger than 1.1 (typically, a liquid), which is so called a liquid immersion method. In this case, it is possible to adopt one of the following techniques as the technique of filling the space in the optical path between the projection optical system and the photosensitive substrate with the liquid: the technique of locally filling the space with the liquid as disclosed in International Publication No. WO99/49504; the technique of moving a stage holding the substrate to be exposed, in a liquid bath as disclosed in Japanese Patent Application Laid-Open No. H6-124873; the technique of forming a liquid bath of a predetermined depth on a stage and holding the substrate therein as disclosed in Japanese Patent Application Laid-Open No. H10-303114, and so on. The teachings of International Publication No. WO99/49504, Japanese Patent Application Laid-Open No. H6-124873, and Japanese Patent Application Laid-Open No. H10-303114 are incorporated herein by reference. In the aforementioned embodiments, it is also possible to apply the so-called polarization illumination method as disclosed in U.S. patent application Laid-Open Nos. 2006/0170901 and 2007/0146676. The teachings of U.S. patent application Laid-Open Nos. 2006/0170901 and 2007/0146676 are incorporated herein by reference.

In the measuring apparatus according to an embodiment of the invention, the intensities of the ±first-order diffracted light components as measurement targets out of the diffracted beams generated through the phase diffraction grating mounted on the object plane in the optical Fourier transform relation with the pupil of the optical system to be examined are equal to each other, and therefore the measuring unit is able to accurately detect each of the diffracted light components, using a relatively narrow dynamic range, and to accurately measure the pupil transmittance distribution of the optical system to be examined. Since the regions where the respective diffracted light components pass through the pupil of the optical system to be examined can be varied by simply changing the angle of incidence of the measurement beam incident to the phase diffraction grating stationarily mounted on the object plane of the optical system to be examined, the pupil transmittance distribution of the optical system to be examined can be quickly measured with a relatively low load.

It will be understood by those skilled in the art that aspects of embodiments of the subject matter disclosed above are intended to satisfy the requirement of disclosing at least one enabling embodiment of the subject matter of each claim and to be one or more such exemplary embodiments only and to not to limit the scope of any of the claims in any way and particularly not to a specific disclosed embodiment alone. Many changes and modification can be made to the disclosed aspects of embodiments of the disclosed subject matter of the claims that will be understood and appreciated by those skilled in the art, particularly in regard to interpretation of the claims for purposes of the doctrine of equivalents. The appended claims are intended in scope and meaning to cover not only the disclosed aspects of embodiments of the claimed subject matter but also such equivalents and other modifications and changes that would be apparent to those skilled in the art. In additions to changes and modifications to the disclosed and claimed aspects of the subject matter disclosed of the disclosed subject matter(s) noted above, others could be implemented.

While the particular aspects of embodiment(s) of the {TITLE} described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present {TITLE} is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for"or, in the case of a method claim, the element is recited as a "step"instead of an "act."

It will be understood also be those skilled in the art that, in fulfillment of the patent statutes of the United States, Applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, Applicant(s) has used from time to time or throughout the present application definitive verbs (e.g., "is", "are", "does", "has", "includes"or the like) and/or other definitive verbs (e.g., "produces,""causes""samples,""reads, ""signals"or the like) and/or gerunds (e.g., "producing,""using,""taking,""keeping,""making," "determining,""measuring,""calculating"or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example,""for example,""as an example, ""illustratively only," "by way of illustration only,"etc., and/or to include any one or more, or all, of the phrases "may be,""can be", "might be,""could be"and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

What is claimed is:

1. A measuring method of measuring a pupil transmittance distribution of an optical system to be examined which forms an image of a first surface, comprising:
   supplying a first beam and a second beam in at least a partially overlapping manner at predetermined positions on the first surface, inclinations of the first and second beams relative to an optical axis of the optical system to be examined being different from each other;
   generating a positive order diffracted beam and a negative order diffracted beam by diffracting the first beam on the first surface;
   generating a positive order diffracted beam and a negative order diffracted beam by diffracting the second beam on the first surface;
   letting the positive order diffracted beam of the first beam, the negative order diffracted beam of the first beam, the positive order diffracted beam of the second beam, and the negative order diffracted beam of the second beam be incident on the optical system to be examined; and
   determining the pupil transmittance distribution by using a measured value of an intensity of the positive order diffracted beam of the first beam having passed through the optical system to be examined, a measured value of an intensity of the negative order diffracted beam of the first beam having passed through the optical system to be examined, a measured value of an intensity of the positive order diffracted beam of the second beam having passed through the optical system to be examined, and a measured value of an intensity the negative order diffracted beam of the second beam having passed through the optical system to be examined.

2. The measuring method according to claim 1, wherein the positive order diffracted beam of the first beam incident on the optical system to be examined passes through a first pupil partial region in an effective region of the pupil of the optical system to be examined, and the negative order diffracted beam of the first beam incident on the optical system to be examined passes through a second pupil partial region apart from the first pupil partial region in the effective region.

3. The measuring method according to claim 2, wherein one of the positive order diffracted beam and the negative order diffracted beam of the second beam incident on the optical system to be examined passes through the first pupil partial region.

4. The measuring method according to claim 2, wherein the positive order diffracted beam of the second beam incident on the optical system to be examined passes through a third pupil partial region apart from the first and second pupil partial regions in the effective region, and the negative order diffracted beam of the second beam passes through a fourth pupil partial region apart from the first to third pupil partial regions in the effective region.

5. The measuring method according to claim 4, wherein the positive order diffracted beam of the first beam, generated through the diffracting the first beam, is a +first-order beam, and the negative order diffracted beam of the first beam, generated through the diffracting the first beam, is a −first-order beam.

6. The measuring method according to claim 5, wherein the first beam and the second beam are incident simultaneously to the predetermined position so that ±third-order diffracted beams of the first beam pass through pupil partial regions apart from the first to fourth pupil partial regions on the pupil, the ±third-order diffracted beams of the first beam being generated through the diffracting the first beam.

7. The measuring method according to claim 2, wherein the determining the pupil transmittance distribution includes determining a relationship between a pupil transmittance in the first pupil partial region and a pupil transmittance in the second pupil partial region.

8. The measuring method according to claim 1, wherein said diffracting the first and second beams comprises imparting a first phase value to light passing through a first phase region on the first surface and imparting a second phase value different from the first phase value to light passing through a second phase region adjacent to the first phase region.

9. The measuring method according to claim 8, wherein the first and second phase regions are alternately arranged on the first surface, and the second phase value is different by it from the first phase value.

10. The measuring method according to claim 8, wherein the first and second phase regions comprise the first phase regions of a rectangular shape and the second phase regions of a rectangular shape arranged in a checkered pattern.

11. The measuring method according to claim 9, wherein the generating the positive order diffracted beam and the negative order diffracted beam, comprises:
imparting the first phase value to light passing through the first phase region on the first surface; and
diffracting the second beam by imparting the second phase value to light passing through the second phase region.

12. The measuring method according to claim 8, further comprising:
supplying a calibration beam through the first surface and the optical system to be examined, to a predetermined position on a second surface on which the image is formed;
diffracting the calibration beam by imparting a third phase value to light passing through a third phase region on the second surface and imparting a fourth phase value different from the third phase value to light passing through a fourth phase region adjacent to the third phase region; and
measuring an intensity of a positive order diffracted beam of the calibration beam and an intensity of a negative order diffracted beam of the calibration beam, the positive order diffracted beam of the calibration beam being generated through the diffracting the calibration beam, the negative order diffracted beam of the calibration beam being generated through the diffracting the calibration beam.

13. The measuring method according to claim 12, wherein the calibration beam is not diffracted by the first surface.

14. The measuring method according to claim 12, further comprising:
letting the positive order diffracted beam of the calibration beam and the negative order diffracted beam of the calibration beam be incident on a measuring optical system, the positive order diffracted beam of the calibration beam having traveled via the first pupil partial region and the optical system to be examined, the negative order diffracted beam of the calibration beam having traveled via the second pupil partial region and the optical system to be examined,
wherein the intensities of the positive order diffracted beam of the calibration beam and the negative order diffracted beam of the calibration beam are measured after passage through the measuring optical system.

15. The measuring method according to claim 14, wherein the intensity of the positive order diffracted beam of the calibration beam and the intensity of the negative order diffracted beam of the calibration beam are measured, the positive order diffracted beam of the calibration beam having been generated through the diffracting the calibration beam and having traveled through the measuring optical system, the negative order diffracted beam of the calibration beam having been generated through the diffracting the calibration beam and having traveled through the measuring optical system.

16. The measuring method according to claim 15, wherein a calculation result of the pupil transmittance distribution is calibrated by using measured values of the intensities of the positive order diffracted beam and the negative order diffracted beam of the calibration beam, the positive order diffracted beam and the negative order diffracted beam of the calibration beam having been generated through the diffracting the calibration beam and having traveled through the measuring optical system.

17. A controlling method of controlling an exposure apparatus which comprises an illumination optical system of illuminating a predetermined pattern, and a projection optical system of forming an image of the predetermined pattern on a photosensitive substrate, comprising:
changing an illumination condition for illumination of the predetermined pattern, based on a measurement result of a pupil transmittance distribution of the projection optical system measured by the measuring method according to claim 1.

18. The controlling method according to claim 17, wherein the illumination condition is at least one of an illuminance distribution on the first surface by the illumination optical system and a pupil luminance distribution on a pupil of the illumination optical system.

19. An exposure method comprising illuminating a predetermined pattern, and performing exposure to transfer the predetermined pattern onto a photosensitive substrate by a projection optical system, comprising:
changing an illumination condition for illumination of the predetermined pattern, based on a measurement result of a pupil transmittance distribution of the projection optical system measured by the measuring method according to claim 1.

20. An exposure method comprising illuminating a predetermined pattern, and performing exposure to transfer the predetermined pattern onto a photosensitive substrate by a projection optical system, comprising:
- using a pattern produced based on a measurement result of a pupil transmittance distribution of the projection optical system measured by the measuring method according to claim 1.

21. A device manufacturing method, comprising:
- performing exposure to transfer the predetermined pattern onto the photosensitive substrate, using the exposure method according to claim 19;
- developing the photosensitive substrate with the predetermined pattern transferred thereon, and forming a mask layer in a shape corresponding to the predetermined pattern on a surface of the photosensitive substrate; and
- processing the surface of the photosensitive substrate through the mask layer.

22. A device manufacturing method, comprising:
- performing exposure to transfer the predetermined pattern onto the photosensitive substrate, using the exposure method according to claim 20;
- developing the photosensitive substrate with the predetermined pattern transferred thereon, and forming a mask layer in a shape corresponding to the predetermined pattern on a surface of the photosensitive substrate; and
- processing the surface of the photosensitive substrate through the mask layer.

\* \* \* \* \*